United States Patent
Bang et al.

(10) Patent No.: US 10,910,080 B2
(45) Date of Patent: *Feb. 2, 2021

(54) NONVOLATILE MEMORY DEVICE CONFIGURED TO ADJUST A READ PARAMETER BASED ON DEGRADATION LEVEL

(71) Applicant: Samsung Electronics Co., Ltd., Suwon-si (KR)

(72) Inventors: Jin Bae Bang, Anyang-si (KR); Seung Hwan Song, Incheon (KR); Dae Seok Byeon, Seongnam-si (KR); Il Han Park, Suwon-si (KR); Hyun Jun Yoon, Changwon-si (KR); Han Jun Lee, Gunpo-si (KR); Na Young Choi, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/865,675

(22) Filed: May 4, 2020

(65) Prior Publication Data

US 2020/0265908 A1    Aug. 20, 2020

Related U.S. Application Data

(63) Continuation of application No. 16/154,111, filed on Oct. 8, 2018, now Pat. No. 10,665,312.

(30) Foreign Application Priority Data

Mar. 14, 2018  (KR) .................... 10-2018-0029752

(51) Int. Cl.
*G11C 27/00*  (2006.01)
*G11C 11/56*  (2006.01)
(Continued)

(52) U.S. Cl.
CPC ............ *G11C 27/00* (2013.01); *G06F 3/0688* (2013.01); *G06F 11/1068* (2013.01);
(Continued)

(58) Field of Classification Search
CPC ......................... G11C 16/26; G11C 16/0483
See application file for complete search history.

(56) References Cited

U.S. PATENT DOCUMENTS

| | | |
|---|---|---|
| 7,876,621 B2 | 1/2011 | Sharon et al. |
| 7,903,468 B2 | 3/2011 | Litsyn et al. |

(Continued)

FOREIGN PATENT DOCUMENTS

| | | |
|---|---|---|
| KR | 2010-0052159 A | 5/2010 |
| KR | 10-2011-0078727 A | 7/2011 |
| KR | 2017-0058066 A | 5/2017 |

*Primary Examiner* — Ajay Ojha
(74) *Attorney, Agent, or Firm* — Harness, Dickey and Pierce, P.L.C.

(57) ABSTRACT

A nonvolatile memory device may include a page buffer including a plurality of latch sets that latch each page datum of selected memory cells among a plurality of memory cells according to each of read signal sets including at least one read signal, and a control logic configured to detect a degradation level of the memory cells and determine a read parameter applied to at least one of the read signal sets based on the detected degradation level.

18 Claims, 19 Drawing Sheets

(51) Int. Cl.
  *G06F 11/10* (2006.01)
  *G11C 16/28* (2006.01)
  *G06F 3/06* (2006.01)
  *G11C 16/26* (2006.01)
  *G11C 16/04* (2006.01)

(52) U.S. Cl.
  CPC ...... *G11C 11/5628* (2013.01); *G11C 11/5642* (2013.01); *G11C 16/26* (2013.01); *G11C 16/28* (2013.01); *G11C 16/0483* (2013.01); *G11C 2211/5634* (2013.01)

(56) References Cited

U.S. PATENT DOCUMENTS

| | | |
|---|---|---|
| 8,576,625 B1 | 11/2013 | Yang et al. |
| 8,630,121 B2 | 1/2014 | Yang |
| 8,811,076 B2 | 8/2014 | Venkitachalam et al. |
| 8,958,250 B2 | 2/2015 | Yang |
| 9,009,390 B2 | 4/2015 | Choi et al. |
| 9,122,404 B2 | 9/2015 | Dai et al. |
| 9,330,775 B2 | 5/2016 | Kim et al. |
| 9,728,279 B2 | 8/2017 | Yim et al. |
| 9,754,683 B2 | 9/2017 | Goldman et al. |
| 2009/0207659 A1 | 8/2009 | Song et al. |
| 2009/0310404 A1 | 12/2009 | Cho et al. |
| 2010/0020611 A1 | 1/2010 | Park |
| 2010/0091535 A1 | 4/2010 | Sommer et al. |
| 2010/0118608 A1 | 5/2010 | Song et al. |
| 2010/0165743 A1* | 7/2010 | Cernea ............... G11C 16/26 365/185.21 |
| 2011/0235415 A1* | 9/2011 | Park ............... G11C 16/0483 365/185.09 |
| 2014/0063940 A1 | 3/2014 | Chen et al. |
| 2014/0153331 A1 | 6/2014 | Jang et al. |
| 2017/0140802 A1 | 5/2017 | Jeon |
| 2017/0162273 A1 | 6/2017 | You et al. |

* cited by examiner

NONVOLATILE MEMORY DEVICE CONFIGURED TO ADJUST A READ PARAMETER BASED ON DEGRADATION LEVEL

CROSS-REFERENCE TO RELATED APPLICATION(S)

This application is a continuation application of U.S. application Ser. No. 16/154,111, filed on Oct. 8, 2018, which claims benefit of priority to Korean Patent Application No. 10-2018-0029752 filed on Mar. 14, 2018 in the Korean Intellectual Property Office, the entire disclosure of each of which is incorporated herein by reference in its entirety.

BACKGROUND

1. Field

Example embodiments of the present inventive concepts relates to nonvolatile memory device.

2. Description of Related Art

Semiconductor memory devices may be roughly divided into volatile semiconductor memory devices and nonvolatile semiconductor memory devices. Volatile semiconductor memory devices have fast reading and writing speeds but stored data may disappear when a power supply is interrupted. On the other hand, nonvolatile semiconductor memory devices may retain stored data even when a power supply is interrupted. Accordingly, nonvolatile semiconductor memory devices may be used to store data that needs to be preserved regardless of whether or not the power is supplied.

Flash memory devices may be a type of nonvolatile memory device. Such flash memory devices are widely used as audio and video data storage media of information devices, such as computers, cellular phones, smartphones, personal digital assistants (PDA), digital cameras, camcorders, voice recorders, MP3 players, handheld PCs, game consoles, facsimiles, scanners, and printers. Recently, technologies for high-capacity, high-speed, and low-power nonvolatile memory devices are being developed to mount nonvolatile memory devices in mobile devices such as smartphones.

SUMMARY

According to example embodiments of the present inventive concepts, a nonvolatile memory device capable of performing a data processing operation in which the generation of error bits is reduced (or, alternatively, minimized), and a data processing method thereof is disclosed.

Example embodiments of the present inventive concepts are directed to a nonvolatile memory device configured to perform a plurality of sensing operations to identify a specific state of memory cells, and select and output a desired (or, alternatively, an optimal) datum among results of the sensing operations.

According to an example embodiment of the present inventive concepts, a nonvolatile memory device includes a page buffer including a plurality of latch sets, the plurality of latch sets configured to latch respective page datums of memory cells according to respective read signal sets, the read signal sets each including at least one read signal; and control logic configured to detect a degradation level of the memory cells, and to determine a read parameter applied to at least one of the read signal sets based on the degradation level.

According to an example embodiment of the present inventive concepts, a nonvolatile memory device includes a page buffer including a plurality of latch sets that latch respective page datums of memory cells according to respective read signal sets, the read signal sets including a prior read signal set and subsequent read signal sets; and control logic configured to detect a degradation level of the memory cells based on the prior read signal set, and to determine a read parameter applied to the subsequent read signal sets based on the degradation level of the memory cells.

According to an example embodiment of the present inventive concepts, a nonvolatile memory device includes a page buffer unit connected to a memory cell array including a plurality of memory cells, the page buffer unit including a plurality of page buffers configured to store page datum of the memory cells; and control logic configured to group the page buffers into a plurality of count sections, and to define an error exclusion range of a read operation of the memory cells based on a count value of at least one of the plurality of count sections.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, various example embodiments of the present inventive concepts will be described with reference to the accompanying drawings.

A NAND-type flash memory device may be used as an example of a nonvolatile memory device according to an example embodiment of the present inventive concepts. However, those skilled in the art may easily understand other features and performances of the example embodiments of the present inventive concepts from information disclosed herein. For example, example embodiments of the present inventive concepts may be applied to a PRAM, an MRAM, a ReRAM, an FRAM, a NOR flash memory, and the like.

Figure 1:
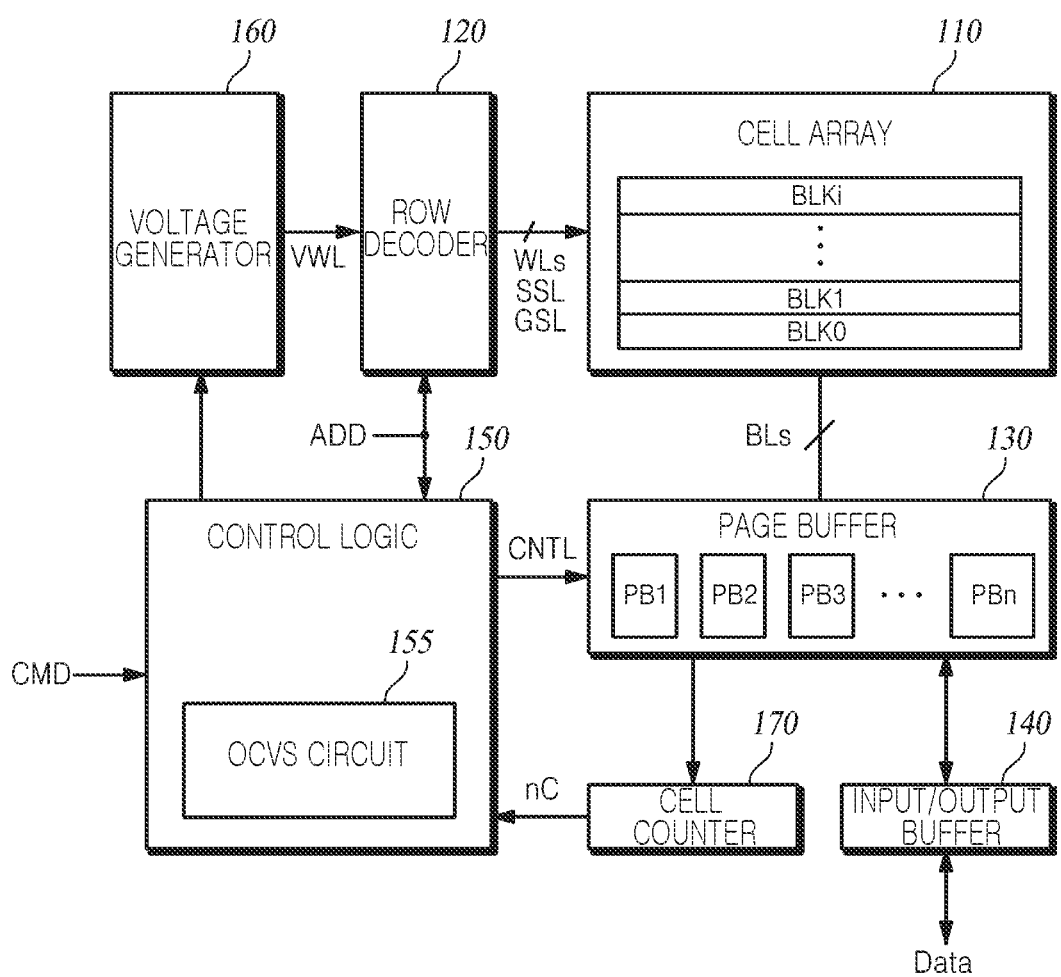
FIG. 1 is a block diagram illustrating a nonvolatile memory device according to an example embodiment of the present inventive concepts.

FIG. 1 is a block diagram illustrating a nonvolatile memory device according to an example embodiment of the present inventive concepts.

Referring to FIG. 1, a nonvolatile memory device 100 may include a cell array 110, a row decoder 120, a page buffer 130, an input/output buffer 140, a control logic 150, a voltage generator 160, and a cell counter 170.

The cell array 110 may be connected to the row decoder 120 via word lines WLs or select lines SSL and GSL. The cell array 110 may be connected to the page buffer 130 via bit lines BLs. The cell array 110 may include a plurality of memory blocks BLK0 to BLKi, and each of the memory blocks BLK0 to BLKi may include a plurality of NAND-type cell strings. Channels of cell strings may be formed in a vertical or a horizontal direction. The cell array 110 may include a plurality of memory cells configured to form a cell string. The plurality of memory cells may be programmed, erased, or read by a voltage provided through the bit lines BLs or the word lines WLs. A program operation may be performed on a page basis, and an erase operation may be performed on a memory blocks basis. Each of the memory blocks BLK0 to BLKi may include a three-dimensional memory array.

The row decoder 120 may select one of the memory blocks BLK0 to BLKi of the cell array 110 in response to an address ADD. The row decoder 120 may select one of the word lines WLs of the selected memory block in response to the address ADD. The row decoder 120 may transmit a word line voltage VWL corresponding to an operation mode to a word line of the selected memory block. During a program operation, the row decoder 120 may transmit a program voltage Vpgm and a program verification voltage Vpgm_fy to a selected word line WL, and a program pass voltage Vpgm_pass to an unselected word line WL. During an erase operation, the row decoder 120 may transmit an erase voltage Vera and an erasing verification voltage Vera_fy to a selected word line WL, and an erase pass voltage Vera_pass to an unselected word line WL. During a read operation, the row decoder 120 may transmit a read voltage Vrd to a selected word line WL, and a read pass voltage Vrd_pass to an unselected word line WL.

In the above description, the read voltage Vrd may be provided to perform the read operation. However, in a broad sense, the read operation according to example embodiments of the present inventive concepts may be understood as including not only the read operation executed by the read voltage Vrd but also operations executed by the program verification voltage Vpgm_fy provided during the program operation and the erasing verification voltage Vera_fy provided during the erase operation. The page buffer 130 may be operated as a write driver or a sense amplifier. During the program operation, the page buffer 130 may transmit a bit line voltage corresponding to data to be programmed to a bit line of the cell array 110. During the read operation, the page buffer 130 may sense data stored in a selected memory cell through the bit line BL. Each of a plurality of page buffers PB1 to PBn included in the page buffer 130 may be connected to one or two of the bit lines BLs.

In order to perform an on-chip valley search (OCVS) read operation according to example embodiments of the present inventive concepts, the control logic 150 may perform a plurality of read operations. More specifically, a state of one of the memory cells may be identified through the plurality of read operations of the OCVS read operation. Here, assuming that a physical page includes a plurality of bit pages, one page datum among a plurality of page datum forming one bit page may be read from the identification of the state of one of the memory cells. Each of the plurality of page buffers PB1 to PBn may perform a plurality of latch operations in order to identify the state of one of the memory cells, that is, to identify one page datum among the plurality of page datum. Each of the plurality of page buffers PB1 to PBn may select or output optimal data among the plurality of page datum latched by the control of the control logic 150.

The input/output buffer 140 may provide externally provided data to the page buffer 130. In addition, the input/output buffer 140 may provide an externally provided command CMD to the control logic 150, and an externally provided address ADD to the control logic 150 and the row decoder 120. In addition, the input/output buffer 140 may output the data latched by the page buffer 130.

The control logic 150 may control the page buffer 130 and the row decoder 120 in response to the externally provided command CMD via the input/output buffer 140. The control logic 150 may control the page buffer 130 and the row decoder 120 to perform programming, reading, and erase operations on the selected memory cells according to the command CMD.

In particular, the control logic 150 may control the page buffer 130 and the voltage generator 160 to perform the OCVS read operation according to the example embodiments of the present inventive concepts. The control logic 150 may control the page buffer 130 to perform a plurality of read operations thereby identifying a specific state of the selected memory cells. The control logic 150 may control the plurality of page buffers PB1 to PBn to store data respectively corresponding to the plurality of read operations in a plurality of latches included in each of the plurality of page buffers PB1 to PBn. The control logic 150 may perform a processing to select desired (or, alternatively, optimal) data among the data latched a plurality of times. In order to select the desired (or, alternatively, the optimal) data, the control logic 150 may refer to a count value nC provided by the cell counter 170. That is, the control logic 150 may control the page buffer 130 to select and output the closest reading result to a valley among a plurality of sensed data. In order to perform such operations, the control logic 150 may include an OCVS circuit 155.

The voltage generator 160 may generate various kinds of word line voltages VWLs to be supplied to word lines WLs and a voltage to be supplied to a bulk, such as a well region, in which the memory cells are formed, under the control of the control logic 150. The word line voltages VWLs to be supplied to the word lines WLs may include a program voltage Vpgm, a pass voltage Vpass, select and non-select read voltages Vrd and Vread, and the like.

The cell counter 170 may count memory cells corresponding to a specific threshold voltage range from the data sensed in the page buffer 130. For example, the cell counter 170 may process data respectively latched in the plurality of page buffers PB1 to PBn to count the number of memory cells having a threshold voltage in a specific voltage range.

The nonvolatile memory device 100 according to the example embodiments of the present inventive concepts may perform a plurality of read operations on the selected memory cells. The nonvolatile memory device 100 may select and output the desired (or, alternatively, the optimal) data among the plurality of data. According to the example embodiments of the present inventive concepts, the nonvolatile memory device 100 may select data sensed by an optimal read voltage to provide highly reliable data.

Figure 2:
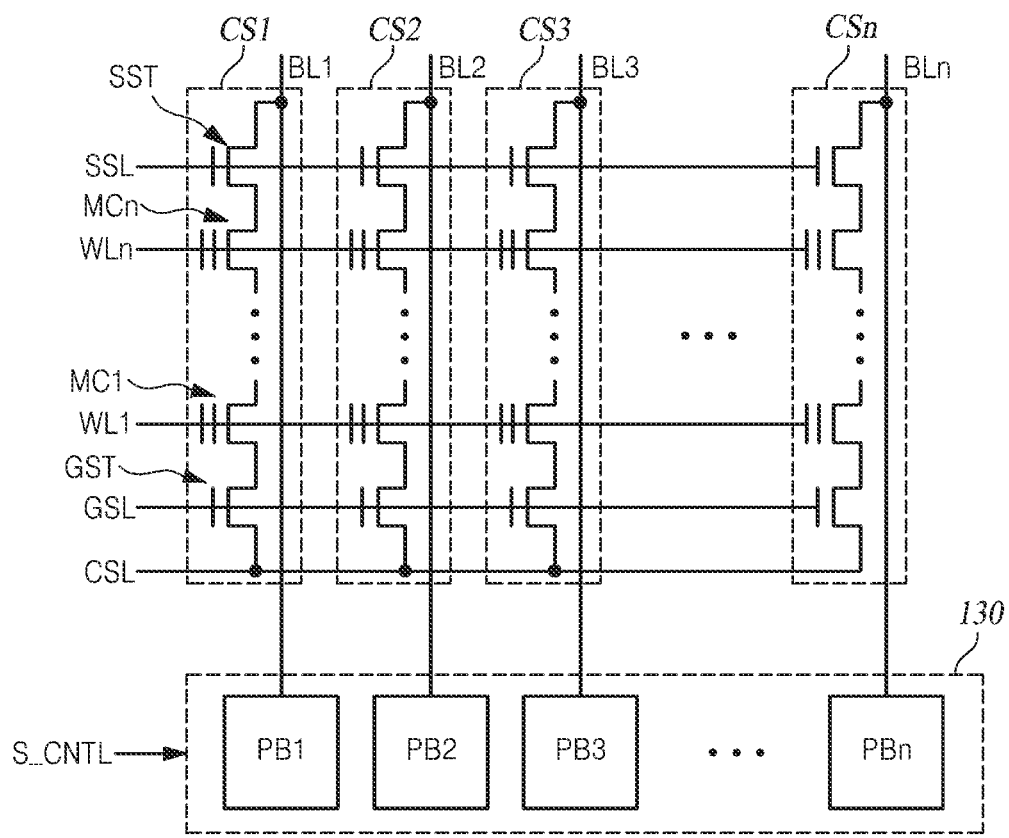
FIG. 2 is a block diagram illustrating a configuration of a cell array and a page buffer illustrated in FIG. 1.

FIG. 2 is a block diagram illustrating a configuration of a cell array and a page buffer in FIG. 1.

Referring to FIG. 2, the page buffers PB1 to PBn may be respectively connected bit lines BL1 to BLn. The bit lines BL1 to BLn may be respectively connected to cell strings CS1 to CSn.

The cell strings CS1 to CSn included in cell array 110 may be respectively connected to the bit lines BL1 to BLn via string select transistor SSTs. A gate of each of the string select transistors SSTs may be connected to a string select line SSL. In addition, each of the cell strings CS1 to CSn may be connected to a common source line CSL via a ground select transistor GST. A gate of the ground select transistor GST may be connected to a ground select line GSL.

The page buffer PB1 may be connected to the cell string CS1 via the bit line BL1. The page buffer PB1 may setup or precharge the bit line BL1 during the program operation. During the read operation, the page buffer PB1 may precharge the bit line BL1 and sense whether the selected memory cell is turned on or turned off. The page buffer PB1 may include transistors to provide a power supply voltage. The page buffer PB1 may receive a control signal S_CNTL from the control logic 150 to control the transistors. The control signal S_CNTL may include a plurality of control signals BLSHF and BLSLT. The bit lines BL1 to BLn may be precharged or developed by the control signals BLSHF and BLSLT.

Figure 3:
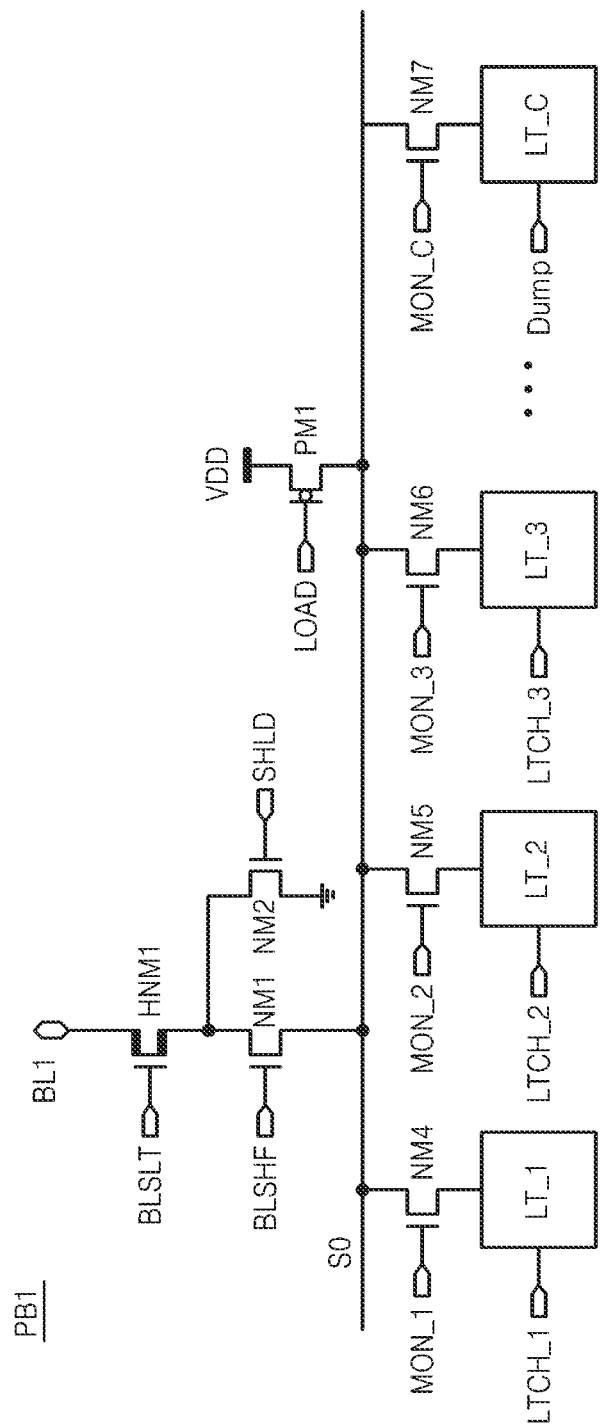
FIG. 3 is a schematic block diagram of the page buffer illustrated in FIGS. 1 and 2.

FIG. 3 is a schematic block diagram of a page buffer illustrated in FIGS. 1 and 2.

Referring to FIG. 3, the page buffer PB1 connected to the bit line BL1 may be connected to memory cells of the cell string CS1 (please refer to FIG. 2). The page buffer PB1 may include a sensing node SO connected to the bit line BL1. The page buffer PB1 may include a plurality of latches LT_1, LT_2, LT_3, and LT_4 connected to the sensing node SO.

During the read operation, the bit line BL1 may be precharged by the control logic 150. For example, when a load signal LOAD and a control signal BLSHF are activated, the bit line BL1 may be precharged to a specific voltage level VBL. Here, a high voltage transistor HNM1 may maintain a turn-on state by a bit line select signal BLSLT.

Next, when the load signal LOAD is deactivated, charges charged in the sensing node SO may flow into the bit line BL1 through a transistor NM1 turned on by the control signal BLSHF. That is, a developing operation by which a voltage level of the sensing node SO changes may be performed. When the selected memory cell is an on-cell, the charges charged in the sensing node SO may be discharged to the common source line CSL through the bit line BL1 and a channel of the cell string CS1. In this case, since a current flowing from the sensing node SO to the bit line BL1 is relatively great, a speed of a voltage drop of the sensing node SO may be relatively high. On the other hand, when the selected memory cell is an on-cell, it is difficult to discharge the charges charged in the sensing node SO to the common source line CSL through the bit line BL1. In this case, since the current flowing from the sensing node SO to the bit line BL1 is relatively small, the speed of the voltage drop of the sensing node SO may be relatively low.

The plurality of latches LT_1, LT_2, LT_3, and LT_4 may receive latch control signals LTCH_1, LTCH_2, LTCH_3, ..., and Dump to sense and store the developed state of the sensing node SO. According to the latch control signals LTCH_1, LTCH_2, LTCH_3, ..., and Dump, the plurality of latches LT_1, LT_2, LT_3, and LT_4 may sense data in the selected memory cells a plurality of times and store the plurality of sensed data. For example, the latch control signals LTCH_1, LTCH_2, LTCH_3, ..., and Dump may be sequentially provided.

According to the example embodiments of the present inventive concepts, the plurality of latches LT_1, LT_2, LT_3, and LT_4 may execute a latch operation in which data in the selected memory cells are sensed a plurality of times and the plurality of sensed data are stored, in order to identify one state of the selected memory cells, that is, in order to identify one page datum among the plurality of page datum, during the OCVS read operation. During the OCVS read operation, a plurality of levels of read voltages may be provided to word lines of the selected memory cells or a plurality of latch signals may be provided to the plurality of latches LT_1, LT_2, LT_3, and LT_4 at different time points, in response to a plurality of read signals. On/off states of the memory cells selected according to the plurality of read signals may be sequentially stored in the plurality of latches LT_1, LT_2, LT_3, and LT_4. That is, since the read signal determines a level of the read voltage or a latch time point of the latch operation, the read signal may be understood as a control signal for determining the level of the read voltage or the latch time point of the latch operation. Hereinafter, the level of the read voltage or the time of the latch operation may be assumed as being determined depending on the level of the read signal.

The cell counter 170 may count the number of the memory cells having threshold voltages disposed between different read voltage levels, using the data stored in the plurality of latches LT_1, LT_2, LT_3, and LT_4. For example, it is assumed that data sensed by first read voltage is stored in first latches LT_1 of each of the page buffers PB1 to PBn, and data sensed by a second read voltage is stored in second latches LT_2 of each of the page buffers PB1 to PBn. Here, the first latches LT_1 of each of the page buffers PB1 to PBn may be referred to as a first latch set, and the second latches LT_2 of each of the page buffers PB1 to PBn may be referred to as a second latch set. When an exclusive OR (XOR) operation is performed between bits stored in the first latches LT_1 of each of the page buffers PB1 to PBn and bits stored in the second latches LT_2 of each of the page buffers PB1 to PBn, the number of memory cells having threshold voltages distributed between the first read voltage and the second read voltage may be calculated. In addition, in some example embodiments, the calculation and comparison of the number of the memory cells having the threshold voltages between the first read voltage and the second read voltage may be executed using a current comparator having a differential amplifier form according to values of bits stored in each of the latches.

One of the latches, for example, a latch LT_1 may be controlled to sequentially latch only the state of the sensing node SO, and each of the plurality of latches LT_2, LT_3, ..., and LT_C may be controlled to copy sensed data from the latch LT_1. In addition, one of the latches, for example, a latch LT_C may be used to output data of one selected from the latches LT_2, LT_3, ..., and LT_C.

Figure 4:
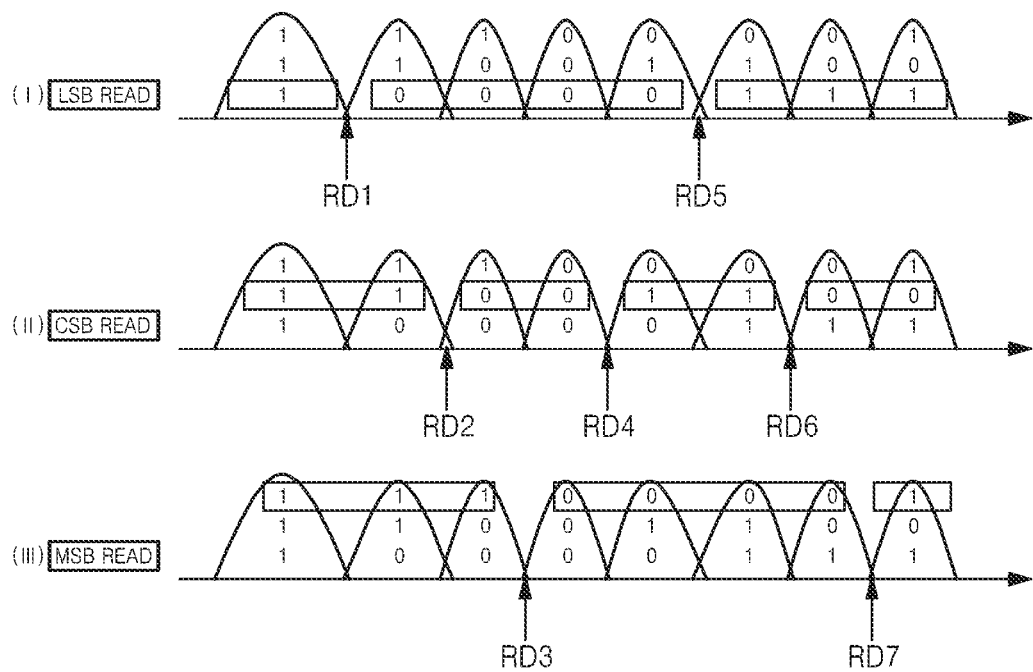
FIG. 4 is a diagram illustrating a normal method of reading a memory cell.

FIG. 4 is a diagram illustrating a normal method of reading a memory cell. Referring to FIG. 4, a page-by-page reading method of a triple level cell (TLC) which stores 3-bit data per cell is illustrated as an example. Hereinafter, an operation according to the example embodiments of the present inventive concepts will be described assuming that the memory cell is the triple level cell (TLC). However, it is obvious that the method to be described below may be applied to a quadruple level cell (QLC) which stores 4 bit data per cell and a multi level cell which stores 4 bit data or more per cell.

The TLC may include a physical page having a plurality of bit pages. For example, the plurality of bit pages may include a least significant bit (LSB) page, a central significant bit (CSB) page, and a most significant bit (MSB) page.

In order to read the LSB page, a read voltage RD1 may be provided to a word line of selected memory cells. A memory cell having a threshold voltage lower than the read voltage RD1 may be stored as a logical '1', and a memory cell having a threshold voltage equal to or higher than the read voltage RD1 may be stored as a logical '0'. Next, a read voltage RD5 may be provided to the word line of the selected memory cells. A memory cell having a threshold voltage lower than the read voltage RD5 may maintain the previously stored logical '0'. A memory cell having a threshold voltage equal to or higher than the read voltage RD5 may be toggled to the logical '1' from the previously stored logical '0'. In addition, a reading result of the LSB page may be output after the processing is completed.

In order to read CSB page, a read voltage RD2 may be provided to the word line of the selected memory cells. A memory cell having a threshold voltage lower than the read voltage RD2 may be stored as a logical '1', and a memory cell having a threshold voltage equal to or higher than the read voltage RD2 may be stored as a logical '0'. Next, a read voltage RD4 may be provided to the word line of the selected memory cells. A memory cell having a threshold voltage lower than the read voltage RD4 may maintain the previously stored logical '0'. A memory cell having a threshold voltage equal to or higher than the read voltage RD4 may be toggled to the logical '1' from the previously stored logical '0'. Finally, a read voltage RD6 may be provided to the word line of the selected memory cells. A memory cell having a threshold voltage lower than the read voltage RD6 may maintain the previously sensed logical value, and a memory cell having a threshold voltage equal to or higher than the read voltage RD6 may be toggled to the logical '1'. A reading result of the CSB page may be output after the processing is completed.

In order to read the MSB page, a read voltage RD3 may be provided to the word line of the selected memory cells. A memory cell having a threshold voltage lower than the read voltage RD3 may be stored as a logical '1', and a memory cell having a threshold voltage equal to or higher than the read voltage RD3 may be stored as a logical '0'. Next, a read voltage RD7 may be provided to the word line of the selected memory cells. A memory cell having a threshold voltage lower than the read voltage RD7 may maintain the previously stored logical '0'. A memory cell having a threshold voltage equal to or higher than the read voltage RD7 may be toggled to the logical '1' from the previously stored logical '0'. A reading result of the MSB page may be output after the processing is completed.

During such a normal read operation, a read fail may occur due to degradation of a memory cell. The nonvolatile memory device 100 according to example embodiments of the present inventive concepts may perform an OCVS read operation to provide high reliability according to an external request or an internal judgment, and provide the result thereof to the outside.

Figure 5:
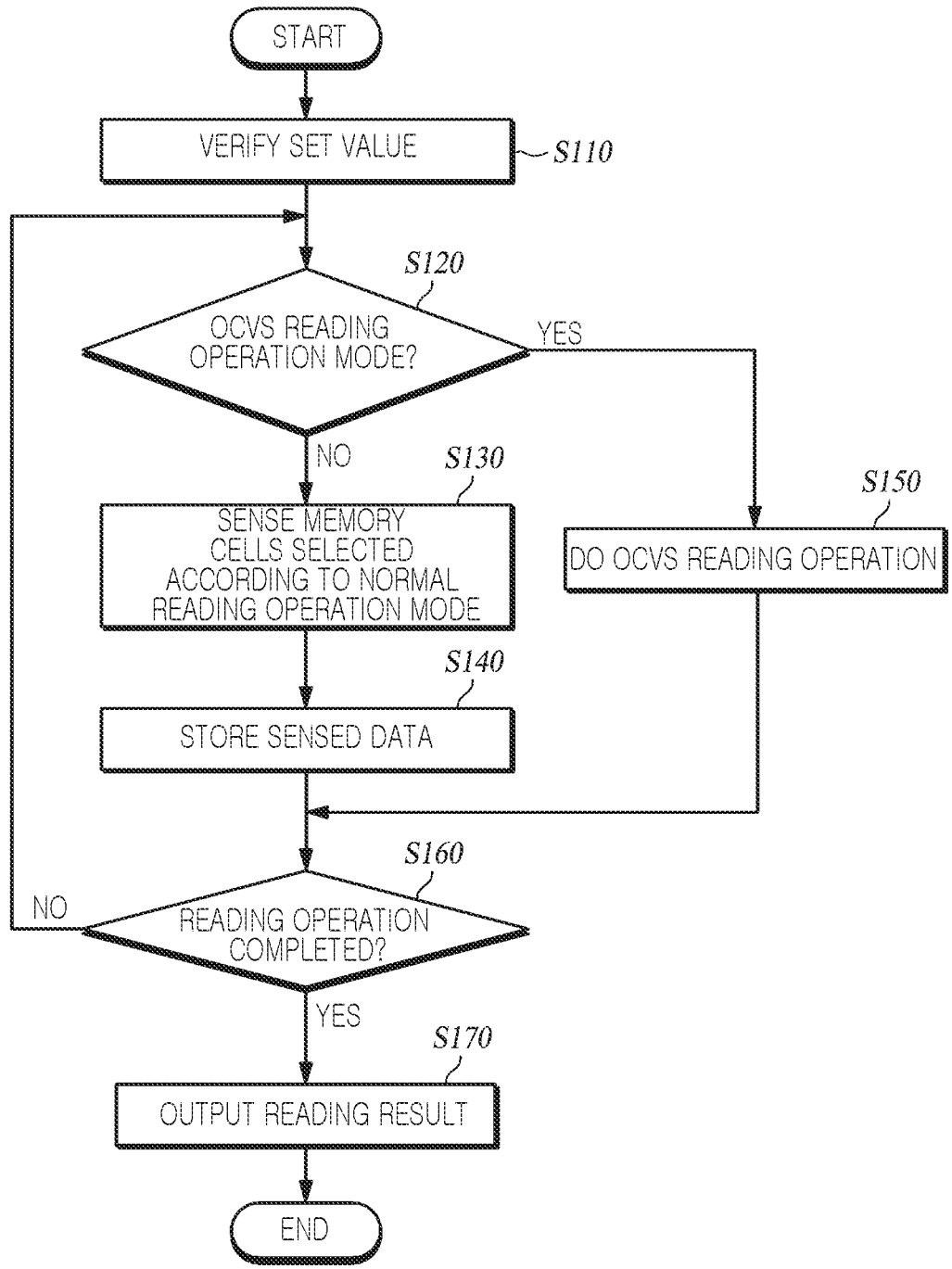
FIG. 5 is a flowchart illustrating a method of reading a nonvolatile memory device according to an example embodiment of the present inventive concepts.

FIG. 5 is a flowchart illustrating a method of reading a nonvolatile memory device according to an example embodiment of the present inventive concepts.

Referring to FIG. 5, a nonvolatile memory device 100 may execute one of a normal read operation and an OCVS read operation according to a set read operation mode.

In operation S110, the nonvolatile memory device 100 may verify a set value related to a requested read operation. For example, the control logic 150 may check whether a page requested to be read is the MSB, the CSB, or the LSB. In addition, the control logic 150 may check the application order of a read signal to read a selected page. Further, the control logic 150 may check whether the mode of the current read operation is the normal read operation mode or the OCVS read operation mode.

In the normal read operation mode, the read signal may be provided once in order to identify one state of a memory cell, that is, in order to identify one page datum among a plurality of page datum. On the other hand, in the OCVS read operation mode, read signals having different levels may be provided a plurality of times to identify one state of a memory cell, and a comparison operation may be performed on the sensed data.

In operation S120, whether or not the read operation mode is the OCVS read operation mode may be determined.

When the read operation mode is not the OCVS read operation mode, in operation S130, the control logic 150 may control the voltage generator 160 and the page buffer 130 to perform the normal read operation in which the read signal is provided once. Accordingly, a read voltage corresponding to the read signal may be provided to the word line of the selected memory cells, and the page buffer 130 may sense whether the memory cells are turned on or turned off. Next, in operation S140, sensed data may be stored in a latch of the page buffer 130.

On the other hand, when the set read operation mode is the OCVS read operation mode, in operation S150, the control logic 150 may control the voltage generator 160 and the page buffer 130 to perform the OCVS read operation in which a read signal is provided a plurality of times. In the OCVS read operation mode, the read voltages having different levels may be provided to the word line of the selected memory cells or a plurality of latch signals may be provided at different time points, according to the plurality of read signals. The OCVS read operation will be discussed in more detail below with regards to FIG. 6.

In operation S160, the control logic 150 may determine whether or not the read operation is completed.

When it is determined that the read operation on the memory cells of the selected page is completed, in operation S170, a reading result calculated in the normal operation mode or the OCVS read operation mode may be output.

In contrast, when an additional read operation is required on the selected memory cells, the control logic 150 may return to operation S120.

Figure 6:
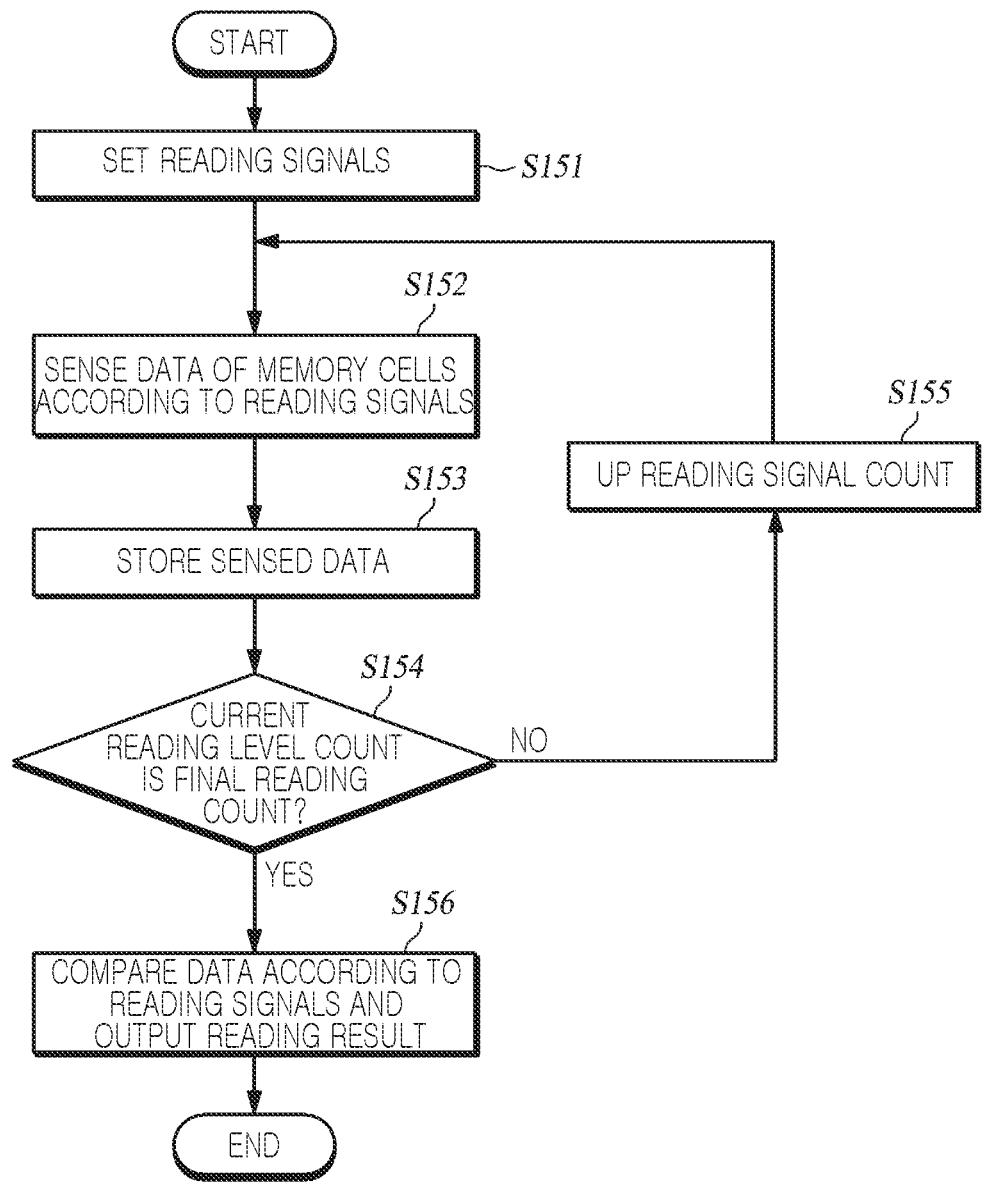
FIG. 6 is a flowchart of an OCVS read operation according to an example embodiment of the present inventive concepts.

FIG. 6 is a flowchart of an OCVS read operation according to an example embodiments of the present inventive concepts.

Referring to FIG. 6, the OCVS read operation illustrated in operation S150 of FIG. 5 is illustrated.

In operation S151, the control logic 150 may set read signals. The read signals may include information of a read count and information about a level of the read signals which determines an interval between the read signals. The read count may represent one specific state of the selected memory cells, that is, the number of searches for one page datum among the plurality of page datum. For example, when the selected memory cells is a TLC, the read count may indicate the number of read signals provided to distinguish an erase state E0 and a program state P1 of the LSB page. That is, the read count may indicate the number of appliance of the read voltages having different levels in a threshold voltage range between the erase state E0 and the program state P1. Alternatively, the read count may refer to the number of data latches performed at different develop time points in a sensing node although the same read voltage is supplied to the selected memory cells. Here, the read count may be set as at least two. In addition, an interval between the read signals may refer to a voltage interval between the read voltages having different levels or a time interval between data latch operations performed at different develop time points.

In operation S152, the control logic 150 may sense data of the selected memory cells according to the read signals. More specifically, the data of the selected memory cells may be sensed depending on the number of appliance of the read voltages and the voltage interval between the read voltages, or depending on the number of the data latches performed at different develop time points and the time interval between the data latch operations.

In operation S153, the control logic 150 may store the sensed data in the latch. Here, data obtained by different read signals may be sensed and stored by different latches.

In operation S154, the control logic 150 may determine whether or not the current read count is the set final read count. The final read count may correspond to a value set in the operation S151.

When the read count of the currently performed read operation is not the final read count, the control logic 150 may proceed to operation S155. In operation S155, the control logic 150 may increment the read count, and operations S152 and S153 may be executed again to sense and store data obtained by the counted-up read signal.

On the other hand, when the read count of the currently performed read operation is the final read count, the control logic 150 may proceed to operation S156. In operation S156, the control logic 150 may compare the data obtained by the read signals having different levels, and a selected reading result may be output as a single reading result.

Figure 7:
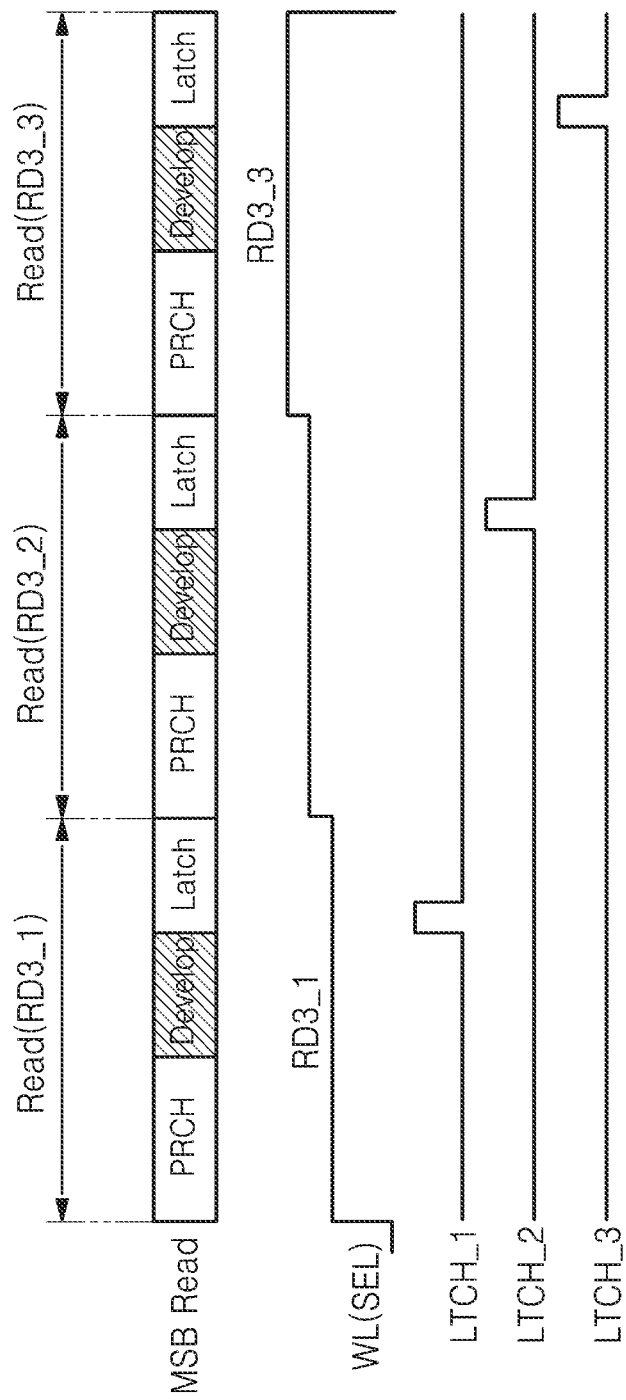
FIG. 7 is a timing diagram illustrating an OCVS read operation performed by read voltages having different levels according to an example embodiment of the present inventive concepts.

FIG. 7 is a timing diagram illustrating an OCVS read operation performed by read voltages having different levels according to an example embodiment of the present inventive concepts.

Referring to FIG. 7, a read voltage supplied to the word line to perform the OCVS read operation may be varied. In order to illustrate the example embodiments of the present inventive concepts, a case in which the OCVS read operation is applied to the MSB page of TLC will be described as an example.

For the OCVS read operation of the MSB page, first, a read voltage RD3_1 may be supplied to the word line of the selected memory cells. In addition, a first latch signal LTCH_1 may be activated when a precharge PRCH and a develop operation on the bit line and the sensing node page are completed by each of the buffers PB1 to PBn. Here, data corresponding to the read voltage RD3_1 may be stored in the first latch set.

Next, a read voltage RD3_2 may be supplied to the word line of the selected memory cells. The read voltage RD3_2 may be higher the read voltage RD3_1, but correspond to a voltage for identifying one state, like the read voltage RD3_1. A second latch signal LTCH_2 may be activated when the precharge PRCH and develop operation on the bit line and the sensing node page are completed by each of the buffers PB1 to PBn. Here, data corresponding to the read voltage RD3_2 may be stored in the second latch set of the page buffers PB1 to PBn.

In addition, a read voltage RD3_3 may be supplied to the word line of the selected memory cells. The read voltage RD3_3 may be higher than the read voltage RD3_2, but correspond to a voltage for identifying one state, like the read voltage RD3_1 and the read voltage RD3_2. A third latch signal LTCH_3 may be activated when the precharge PRCH and develop operation on the bit line and the sensing node page are completed by each of the buffers PB1 to PBn. Here, data corresponding to the read voltage RD3_3 may be stored in the third latch set. Next, by comparing the results stored in the first to third latch sets, one of the latches set may be selected.

Figure 8A:
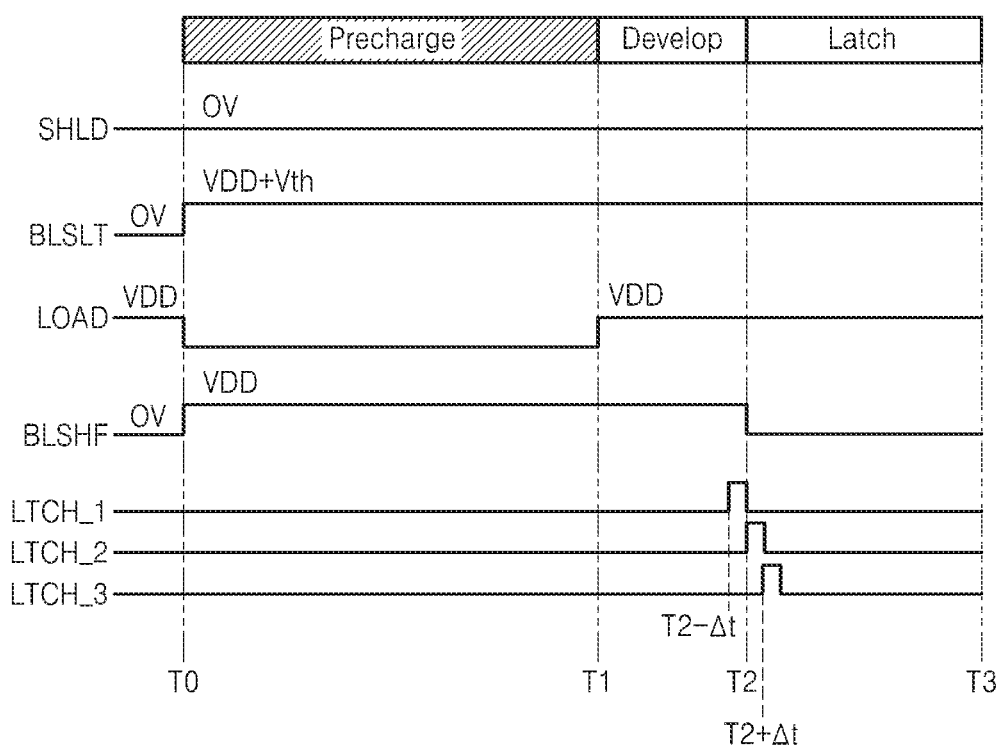
FIG. 8A is a timing diagram illustrating an OCVS read operation executed by a latch signal provided at different time points according to an example embodiment of the present inventive concepts.

FIG. 8A is a timing diagram illustrating an OCVS read operation executed by a latch signal provided at different time points according to an example embodiment of the present inventive concepts.

Referring to FIGS. 3 and 8A, the OCVS read operation may be performed in such a manner that a sensing node is sensed at different develop time points and a plurality of sensed data are stored.

From time T0 to time T1, a precharge operation may be executed. In the precharge operation, bit lines BL1 to BLn and sensing nodes SOs, connected to the plurality of page buffers PB1 to PBn, may be charged. For example, when the control signals BLSHF and BLSLT and the load signal LOAD are activated, the sensing node SO and the bit line BL may be precharged to a specific level.

At time T1, when the load signal LOAD is deactivated at a high level, a PMOS transistor PM1 is turned off to interrupt current supply from a power supply to the sensing node SO. As a result, a level of the sensing node SO may vary with the magnitude of a current flowing into the bit line BL depending on whether the memory cells are turned on or turned off.

When the selected memory cell is an on-cell, the current flowing into the bit line BL may be relatively large. Accordingly, the level of the sensing node SO may be relatively quickly lowered. On the other hand, when the selected memory cell is an off-cell, the level of the sensing node SO may be maintained at a substantially constant level.

However, memory cells distributed near the valley may be memory cells placed at a boundary between the on-cell and the off-cell. Accordingly, a determination whether the memory cells are the on-cell or the off-cell may be changed according to the develop time point. That is, even when the develop time point slightly decreases, the memory cells distributed near the valley may be identified as an off-cell. On the other hand, even when the develop time point slightly increases, the memory cells distributed near the valley may be identified as an on-cell. That is, in the memory cells having a threshold voltage with similar levels to the read voltage provided to the word line, an effect of sensing with increased read voltage may be expected by advancing the develop time. On the other hand, in the memory cells having a threshold voltage distributed around the read voltage, an effect of sensing with lowered read voltage may be expected by delaying the develop time. Accordingly, sensing of the sensing node SO a plurality of times at different develop time points may have the same effect as sensing of the sensing node SO by changing a word line voltage and thereby precharging the bit line BL.

The control signal LTCH_1 may be activated at a time point earlier than time T2 by Δt. That is, the control signal LTCH_1 for latching a logical value corresponding to a state of the sensing node SO may be provided to the first latch LT_1 of each of the page buffers PB1 to PBn under the same read voltage condition. In addition, at time T2, the control signal LTCH_2 for latching a state of the sensing node SO may be provided to the second latch LT_2 of each of the page buffers PB1 to PBn. Further, at a time point later than time T2 by Δt, the control signal LTCH_3 for latching the state of the sensing node SO may be provided to the third latch LT_3 of each of the page buffers PB1 to PBn.

Figure 8B:
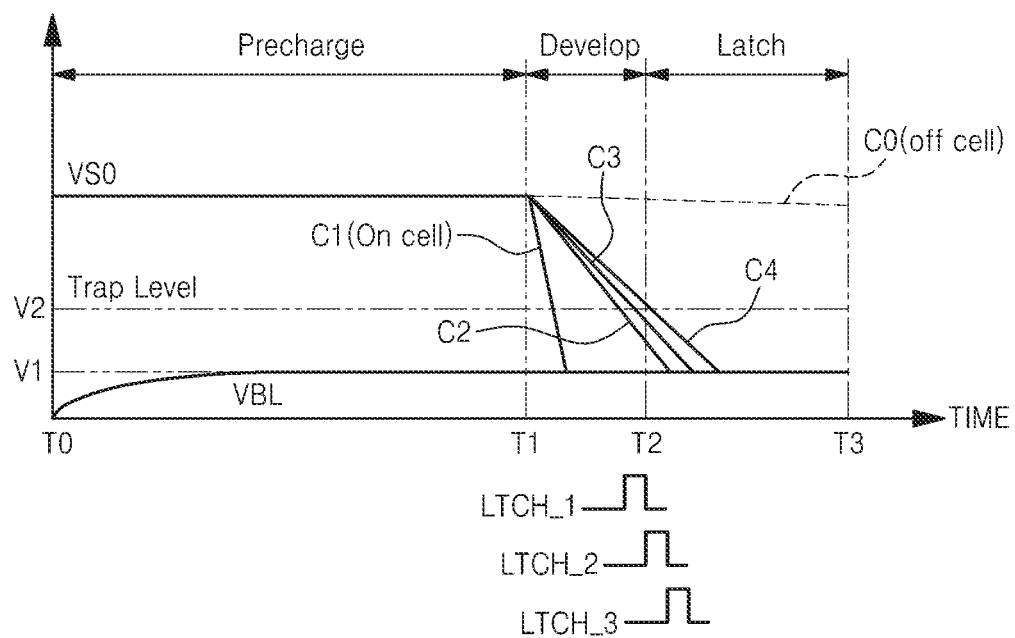
FIG. 8B is a waveform diagram illustrating a level change of a sensing node under control signal conditions of FIG. 8A.

FIG. 8B is a waveform diagram illustrating a level change of a sensing node under the control signal conditions of FIG. 8A.

Referring to FIG. 8B, the level change of the sensing node SO may depend on the threshold voltage level of a memory cell and a latch result at the develop time point.

For example, a period from time T0 to time T1 may be referred to as a precharge period, a period from time T1 to time T2 may be referred to as a develop period, and a period after a time T2 may be referred to as a latch period. Meanwhile, as described above with reference to FIG. 7, the load signal LOAD may be deactivated in the develop period, and the control signal BLSHF may be deactivated in the latch period.

In the precharge period, both of the load signal LOAD and the control signal BLSHF may be activated to precharge the bit line BL and the sensing node SO. In the precharge period, the bit line voltage level VBL may be charged to a first voltage level V1. In the precharge period, the sensing node SO may be charged to a sensing node voltage VSO.

At time T1 at which the develop period starts, the load signal LOAD may be deactivated. In this period, the control signal BLSHF may still maintain an activated state. Accordingly, charges charged in the sensing node SO may move to the bit line BL according to the threshold voltage level of a memory cell.

In a case of a strong off-cell having a threshold voltage higher than a read voltage, a level change of the sensing node SO may be relatively small. A potential change of the sensing node SO of the strong off-cell during the develop period is indicated by the dotted line C0 in FIG. 8B. In a case of a strong on-cell having a threshold voltage lower than the read voltage, the level change of the sensing node SO may be relatively large. A potential change of the sensing node SO of the strong on-cell during the develop period is indicated by the solid line C1 in FIG. 8B. Both of the strong off-cell and the strong on-cell may not be significantly affected by a slight change of the develop time point.

Potential changes of the sensing nodes SO sensing the memory cells having threshold voltages distributed near the read voltage are respectively indicated by the solid lines C2, C3, and C4 in FIG. 8B. The solid line C2 illustrates a develop tendency of a memory cell having a threshold voltage slightly lower than the read voltage. The solid line C3 illustrates a develop tendency of a memory cell having a threshold voltage almost similar to the read voltage. The solid line C4 illustrates a develop tendency of a memory cell having a threshold voltage slightly higher than the read voltage.

The first latch signal LTCH_1 for latching the sensing node SO of memory cells may be provided at a latch time point earlier than the time T2 by a reference time. When the sensing nodes SO is latched by the first latch signal LTCH_1, a logical value corresponding to an off-cell and a logical value corresponding to an on-cell may be respectively latched in the strong off-cell and the strong on-cell. However, a logical value corresponding to the on-cell may be latched in memory cells having a relatively low threshold voltage corresponding to the solid line C2. On the other hand, a logical value corresponding to an off-cell may be latched in memory cells corresponding to the solid lines C3 and C4.

When the sensing nodes SO are latched by the second latch signal LTCH_2, a logical '0' and a logical '1' may be respectively latched in the strong off-cell (corresponding to C0) and the strong on-cell (corresponding to C1), as in the case of the first latch signal LTCH_1. However, in the case of memory cells corresponding to the solid line C2, the logical value corresponding to the on-cell may be latched. On the other hand, in the case of memory cells corresponding to the solid line C3, a trap level potential V2 of the sensing node SO may be latched by the second latch signal LTCH_2. That is, the logical '0' and the logical '1' may not be distinguished. In the case of memory cells corresponding to the solid line C4, a logical value corresponding to the off-cell may be latched.

When the sensing nodes SO are latched by the third latch signal LTCH_3, a logical '0' and a logical '1' may be respectively latched in the strong off-cell (corresponding to C0) and the strong on-cell (corresponding to C1), as in the case of the first latch signal LTCH_1. However, in the case of memory cells having threshold voltages corresponding to the solid lines C2 and C3, a logical '1' corresponding to the on-cell may be latched, and in the case of memory cells having a threshold voltage corresponding to the solid line C4, a logical '0' corresponding to the off-cell may be latched.

As set forth above, a method of latching a state of the sensing node SO in different develop time points in order to identify a state of one of memory cells is described. Depending on the develop time point, an effect substantially similar to an effect of supplying different levels of read voltages to a word line may be provided.

Figure 9:
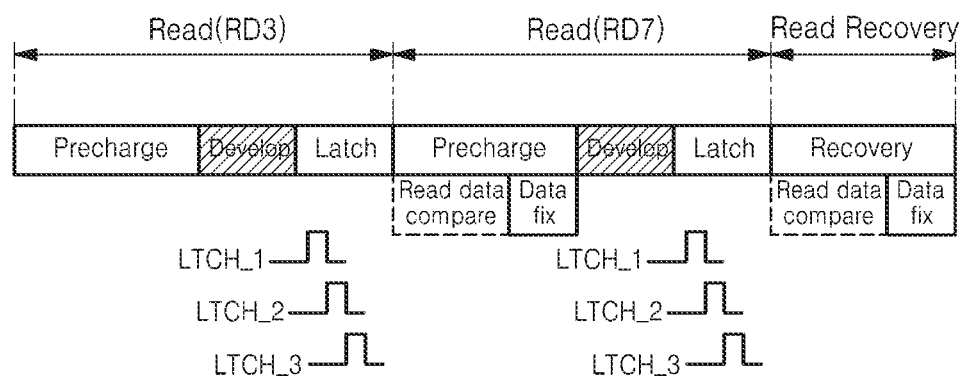
FIG. 9 is a timing diagram illustrating an example in which the OCVS read operation according to the example embodiment described with reference to FIGS. 8A and 8B is applied to the most significant bit (MSB) page of a triple level cell (TLC)

FIG. 9 is a timing diagram illustrating an example in which the OCVS read operation according to the example embodiment described with reference to FIGS. 8A and 8B is applied to the most significant bit (MSB) page of a triple level cell (TLC).

Referring to FIG. 9, a read operation based on a read voltage RD3 and a read operation based on a read voltage RD7 may be executed in order to read the MSB page of the TLC. Next, a read recovery in which voltages of a page buffer and a word line are initialized may be executed.

First, in order to perform the OCVS read operation based on the read voltage RD3, the bit line and the sensing node SO may be precharged. The read voltage RD3 may be supplied to a word line of selected memory cells. When the precharge is completed, a developing operation by which a potential change of the sensing node SO is generated depending on the state of a memory cell may be performed in the page buffers PB1 to PBn (please refer to FIG. 2). In addition, states of the selected memory cells may be sequentially latched by the latch signals LTCH_1, LTCH_2, and LTCH_3 provided at different time points. At this time, latched data may be stored in a plurality of latches included in each of the page buffers PB1 to PBn.

Next, the bit line and the sensing node SO may be precharged to perform the OCVS read operation based on the read voltage RD7. The read voltage RD7 may be supplied to the word line of the selected memory cells. When the precharge is completed, a developing operation by which a potential change of the sensing node SO is generated depending on the state of a memory cell may be performed in the page buffers PB1 to PBn. In addition, states of selected memory cells may be sequentially latched by the latch signals LTCH_1, LTCH_2, and LTCH_3 provided at different time points, and the latched data may be stored in a plurality of latches included in each of the page buffers PB1 to PBn.

In the precharge period of the read operation based on the read voltage RD7, a comparison and select operation may be performed on the data latched in the latches included in each of the page buffers PB1 to PBn. That is, data latched by the first latch signal LTCH_1 and data latched by second latch signal LTCH_2 may be compared to count the number of memory cells. In addition, data latched by the second latch signal LTCH_2 and data latched by the third latch signal LTCH_3 may be compared to count the number of memory cells. By comparing the numbers of the counted memory cells, one of data sets latched by the latch signals LTCH_1, LTCH_2, and LTCH_3 may be selected. The process is indicated by Data fix in FIG. 9.

When the OCVS read operation based on the read voltage RD7 is completed, the data comparing and selecting operation as well as the read recovery may be performed in a pipeline manner. In the read recovery period, the bit line and the sensing nodes SO may recover an initial voltage level. Here, under the condition of the read voltage RD7, one of the data sets respectively latched by the latch signals LTCH_1, LTCH_2, and LTCH_3 may be selected by the comparing operation. In addition, the OCVS result based on the read voltage RD3 and the OCVS result based on the read voltage RD7 may be processed to determine MSB data.

Figure 10A:
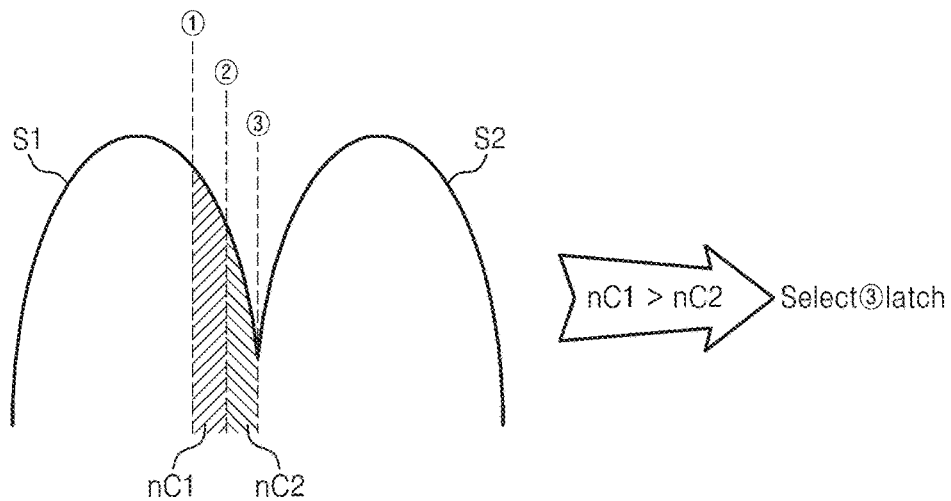
FIGS. 10A, 10B, and 10C are diagrams respectively illustrating methods of selecting data using three latch results of a sensing node.
Figure 10B:
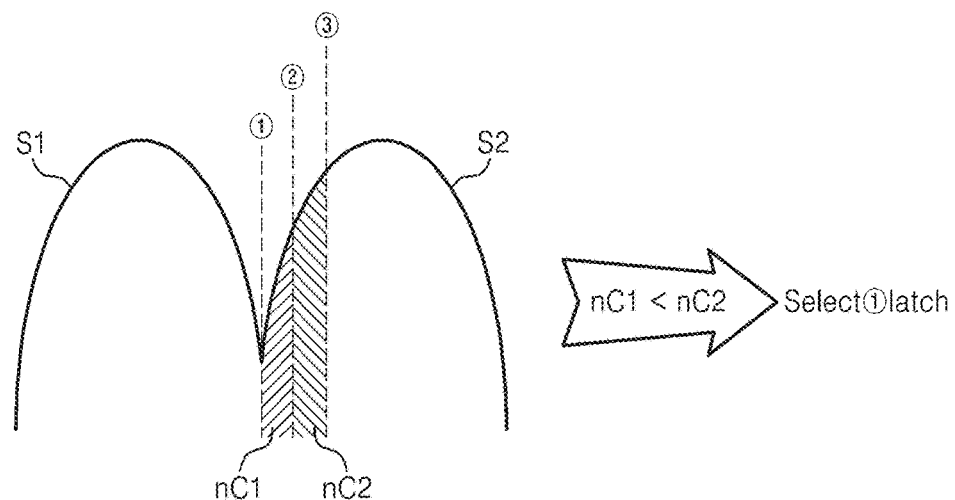
Figure 10C:
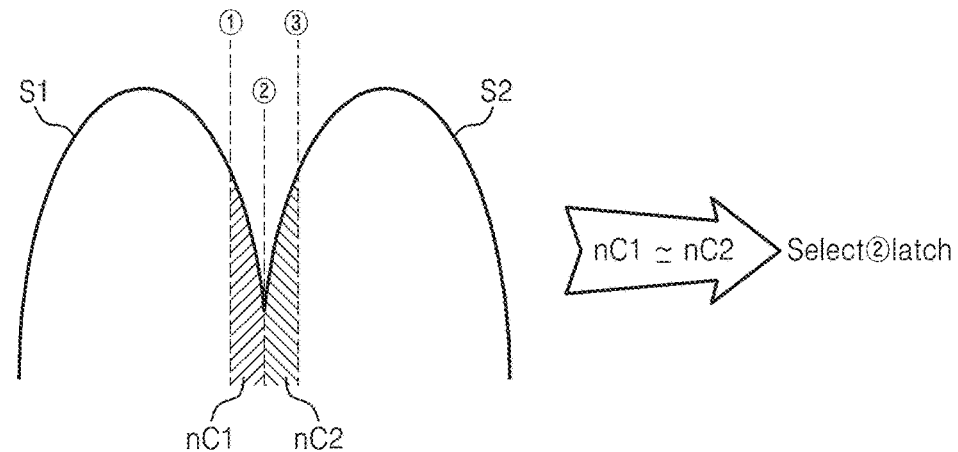

FIGS. 10A, 10B, and 10C are diagrams FIGS. 10A, 10B, and 10C are diagrams respectively illustrating methods of selecting data using three latch results of a sensing node SO. FIG. 10A illustrates a method of selecting data in a case in which threshold voltages of memory cells sensed by the OCVS read operation are distributed at the left of a valley. FIG. 10B illustrates a method of selecting data in a case in which threshold voltages of memory cells sensed by the OCVS read operation are distributed at the right of the valley. FIG. 10C illustrates a method of selecting data in a case in which threshold voltages of memory cells sensed by the OCVS read operation are distributed near the valley.

Referring to FIGS. 10A, 10B, and 10C, a level of a threshold voltage of a memory cell stored in latch sets may be modeled according to the OCVS read operation for distinguishing two states S1 and S2 of the memory cell. When a read voltage is latched at different time points or read voltages at different levels are provided, the distribution of threshold voltages of the memory cells may be illustrated in the scatter diagrams of FIGS. 10A, 10B, and 10C. For example, under the same read voltage condition, states of the sensing node SO respectively latched by the first latch signal LTCH_1, the second latch signal LTCH_2, and the third latch signal LTCH_3 may be matched with data respectively sensed and stored by read voltages ①, ②, and ③ corresponding to the read signals. Latch results respectively corresponding to the read voltages ①, ②, and ③ corresponding to the read signals may be referred to as a first latch set, second latch set, and a third latch set. That is, each of the first latch set, the second latch set, and the third latch set may represent latches which store the data latched by the first latch signal LTCH_1, the second latch signal LTCH_2, and the third latch signal LTCH_3 among the plurality of latch sets.

Under the assumption, memory cells having threshold voltages distributed between the read voltage ① and the read voltage ② may be counted by comparing the first latch set and the second latch set. For example, when the data respectively latched in the first latch set and the second latch set are processed in an exclusive OR (XOR) operation, the number nC1 of memory cells having the threshold voltages distributed between the read voltage ① and the read voltage ② may be counted. Similarly, the number nC2 of memory cells having threshold voltages distributed between the read voltage ② and the read voltage ③ may also be counted. Such count operations may be executed by the cell counter 170 illustrated in FIG. 1.

When the numbers nC1 and nC2 of the memory cells are counted, the control logic 150 may compare a difference value (|nC1-nC2|) between the number nC1 of first memory cells and the number nC2 of the second memory cells with a first reference value A. Meanwhile, when the difference value (|nC1-nC2|) is equal to or greater than the first reference value A, the number nC1 of the counted first memory cells and the number nC2 of the counted second memory cells may be compared. According to the results of the comparison between the number nC1 of the first memory cells and the number nC2 of the second memory cells, data stored in one of the first latch set and the third latch set may be selected. Meanwhile, when the number nC1 of the counted first memory cells and the number nC2 of the counted second memory cells are equal to or greater than a second reference value B, it is determined as a read fail and read recovery may be executed. In addition, when the difference value (|nC1-nC2|) is smaller than the first reference value A, data stored in the second latch set may be selected. In this case, one of the number nC1 of the counted first memory cells and the number nC2 of the counted second memory cells may be output without being compared with the second reference value B. That is, when the difference value (|nC1-nC2|) is smaller than the first reference value A, the first reference value A may define an error exclusion range since one of the number nC1 of the counted first memory cells and the number nC2 of the counted second memory cells may be output without being compared with the second reference value B.

Referring to FIG. 10A, the control logic 150 may select a latch set corresponding to the read voltage ③ when it is determined that the difference value (|nC1-nC2|) is equal to or greater than the first reference value A and smaller than second reference value B and the number nC1 of the counted first memory cells is greater than the number nC2 of the counted second memory cells. That is, a reading result corresponding to the valley may be determined as the data stored in the third latch set.

Referring to FIG. 10B, the control logic 150 may select a latch set corresponding to the read voltage ① when it is determined that the difference value (|nC1-nC2|) is equal to or greater than the first reference value A and smaller than second reference value B and the number nC2 of the counted second memory cells is greater than the number nC1 of the counted first memory cells. That is, the reading result corresponding to the valley may be determined as the data stored in the first latch set.

Referring to FIG. 10C, the control logic 150 may select a latch set corresponding to the read voltage ② when it is determined that the difference value (|nC1-nC2|) is smaller than the first reference value A, that is, the number nC1 of the counted first memory cells is the same as the number nC2 of the counted second memory cells or the different therebetween is less than a reference value. That is, the reading result corresponding to the valley may be determined as the data stored in the second latch set.

FIGS. 11A, 11B, 11C, and 11D are diagrams respectively illustrating methods of selecting data using two latch results of a sensing node SO. Since FIGS. 11A to 11D are similar to FIGS. 10A to 10C, duplicated descriptions thereof will be omitted and differences will be mainly described.

When the number nC0 of memory cells is counted, the control logic 150 may compare the number nC0 of the memory cells with a first reference value A and a second reference value B. The first reference value A may be smaller than the second reference value B.

When the number nC0 of the memory cells is equal to or greater than the second reference value B, it is determined as a read fail and read recovery may be executed. Meanwhile, since the first reference value A is smaller than the second reference value B, the first reference value A may define an error exclusion range.

Meanwhile, when the number nC0 of the memory cells is equal to or greater than the first reference value A and smaller than the second reference value B, the number nC1 of counted first memory cells may be compared with the number nC2 of counted second memory cells. Depending on the result of comparison between the number nC1 of the counted first memory cells and the number nC2 of the counted second memory cells first memory cells, data stored in one of a first latch set and a third latch set may be selected.

In addition, when the number nC0 of the memory cells is smaller than the first reference value A, data stored in one of the first latch set and the second latch set may be selected.

Figure 11A:
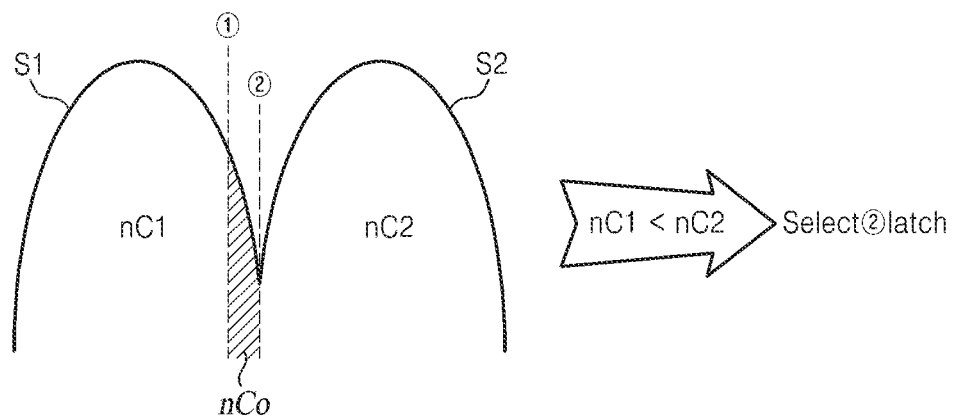
FIGS. 11A, 11B, 11C, and 11D are diagrams respectively illustrating methods of selecting data using two latch results of a sensing node.

Referring to FIG. 11A, the control logic 150 may select a latch set corresponding to the read voltage ② when it is determined that the number nC0 of the memory cells is equal to or greater than the first reference value A and smaller than the second reference value B and the number nC1 of the first memory cells is smaller than the number nC2 of the second memory cells. That is, a reading result corresponding to the valley may be determined as data stored in the second latch set.

Figure 11B:
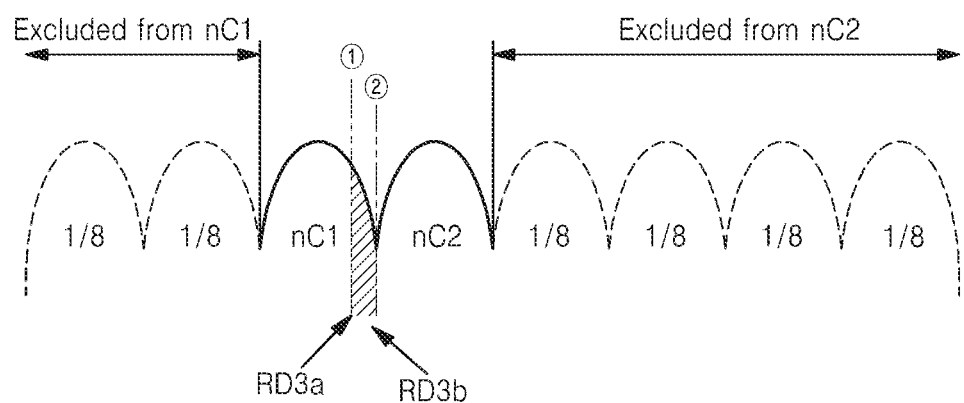

FIG. 11B illustrates a method of counting memory cells at a level equal to, smaller than, or greater than a specific level in the above-described states S1 and S2. FIG. 11B illustrates a method of counting memory cells in a specific state in which an OCVS read operation is performed on a multi level cell (MLC) or a triple level cell (TLC).

Referring to FIG. 11B, the number nC1 of the first memory cells may be calculated by subtracting the number (⅔) of memory cells allocated to two states from the reading result (the number of on-cells) obtained based on the read voltage ①. In addition, the number nC2 of the second memory cells may be calculated by subtracting the number (⅘) of memory cells allocated to four states from the reading result (the number of off-cells) obtained based on the read voltage ②.

Figure 11C:
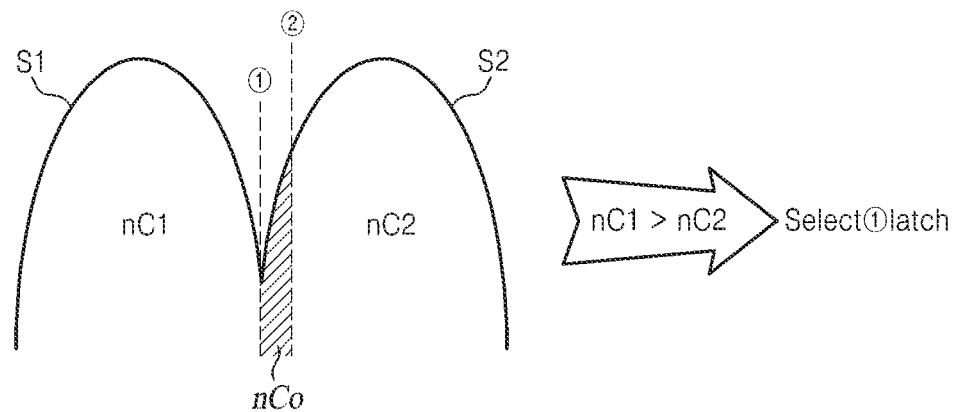

Referring to FIG. 11C, the control logic 150 may select a latch set corresponding to the read voltage ① when the number nC0 of the memory cells is equal to or greater than the first reference value A and smaller than the second reference value B and the number nC1 of the counted first memory cells is greater than the number nC2 of the counted second memory cells. That is, the reading result corresponding to the valley may be determined as data stored in the first latch set.

Figure 11D:
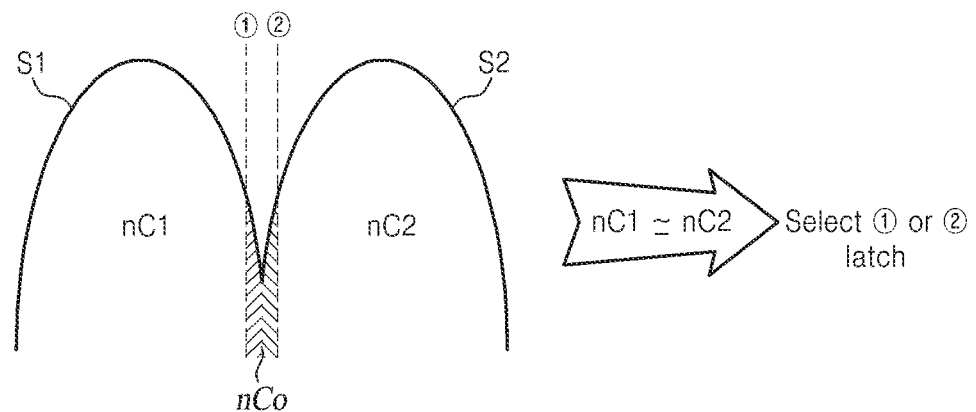

Referring to FIG. 11D, the control logic 150 may select and output the first latch set or the second latch set when the number nC0 of the memory cells is smaller than the first reference value A, that is, it is determined that the number nC1 of the counted first memory cells is the same as or similar to the number nC2 of the counted second memory cells.

Meanwhile, the above-described first reference value A may be a value set to derive a valley in both of an initial state and a retention state of the memory cells. Accordingly, the first reference value A may cover both of the initial state and the retention state, but may not precisely derive a desired (or, alternatively, an optimal) valley. More specifically, referring to the example embodiments illustrated in FIGS. 10A to 10C, the number nC1 of the first memory cells, the number nC2 of the second memory cells, and the difference value (|nC1-nC2|) having a level increasing as the distribution of threshold voltages gradually enters the retention state. When assuming that the difference value (|nC1-nC2|) which increases with time in the retention state is greater than the first reference value A, data stored in one of the first latch set and the third latch set may be output. However, there is a problem in that a read fail error may occur since the number nC1 of the first memory cells and the number nC2 of the second memory cells, having increased count levels, become greater than the second reference value B. Accordingly, data stored one of the first latch set and the third latch set may be output without comparing the first latch set and the third latch set with the second reference value B, by increasing the first reference value A in response to the increment of the difference value (|nC1-nC2|).

In addition, although the OCVS read operation provides a plurality of read signals to identify a state of selected memory cells, the desired (or, alternatively, the optimal) valley may not be precisely derived or an excessive reading time may be required to derive the desired (or, alternatively, the optimal) valley since levels of or intervals between the plurality of read signal are fixed or the number of the plurality of read signals are fixed.

Figure 12:
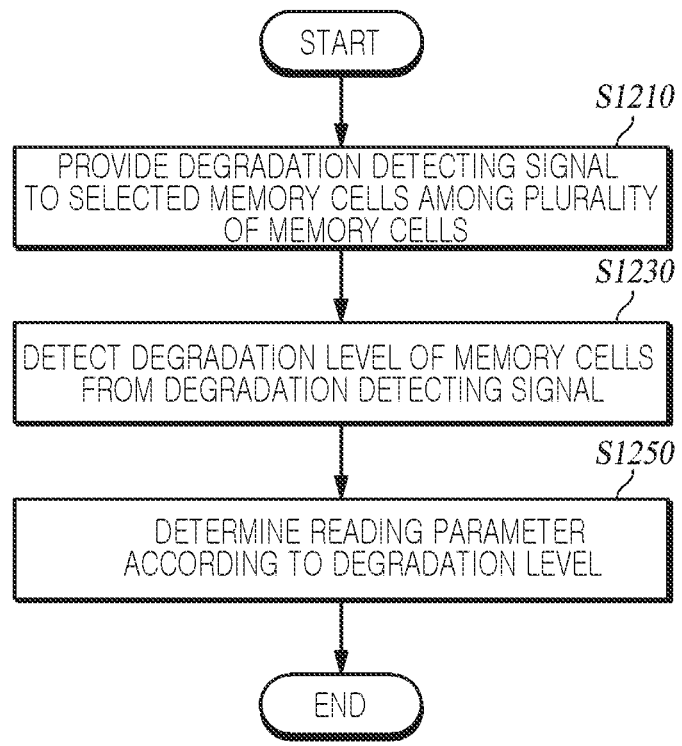
FIG. 12 is a flowchart illustrating a method of compensating for degradation of a nonvolatile memory device according to an example embodiment of the present inventive concepts.

FIG. 12 is a flowchart illustrating a method of compensating for degradation of a nonvolatile memory device according to an example embodiment of the present inventive concepts.

In operation S1210, the control logic 150 may provide a degradation detection signal to selected memory cells among a plurality of memory cells. The control logic 150 may provide the degradation detection signal to a word line of the memory cells according to externally provided command CMD or address ADD. The control logic 150 may provide the degradation detection signal to the word line of the memory cells to perform a set (or, alternatively, a predetermined) dummy read operation. That is, the degradation detection signal according to the example embodiment of the present inventive concepts may be understood as a dummy voltage to perform the dummy read operation. Assuming that a physical page includes three bit pages LSB, CSB, and MSB, the degradation detection signal may be provided prior to a read operation of each of the bit pages to detect a degradation level of each of the bit pages in each read operation. In addition, assuming that the bit page includes three page datum, the degradation detection signal may be provided prior to a read operation of each of the page datum to detect a degradation level of each of the page datum in each read operation. In addition, the degradation detection signal may be provided prior to a read operation of each of the memory cells connected to different word lines to detect a degradation level of each of the different memory cells in each read operation.

The degradation detection signal may have a voltage level corresponding to one of a plurality of states of the selected memory cells. For example, the degradation detection signal may have a voltage level corresponding to one of the highest state and the lowest state among the plurality of states of the selected memory cells.

When a degradation detection signal having a voltage level corresponding to the highest state is provided to a word line of the selected memory cells, the control logic 150 may count off-cells among the selected memory cells. When a degradation detection signal having a voltage level corresponding to the lowest state is provided to the word line of the selected memory cells, the control logic 150 may count on-cells among the selected memory cells. For example, the degradation detection signal corresponding to the highest state may have a voltage level corresponding to a threshold voltage disposed between the highest state and a previous state of the highest state, more specifically, between the highest state and a state immediately below the highest state, and the degradation detection signal corresponding to the lowest state may have a voltage level corresponding to a threshold voltage disposed between the lowest state and a next state of the lowest state, more specifically, between the lowest state and a state immediately above the lowest state.

In operation S1230, the control logic 150 may detect a degradation level of the selected memory cells depending on count values of the on-cells and off-cells counted when the degradation detection signal is provided. For example, assuming that the degradation detection signal corresponding to the highest state is provided to the selected memory cells and the number of off-cells is counted, the control logic 150 may determine the degradation level by comparing the count value of the off-cells in the current highest state with the count value of the off-cells in the initial highest state.

When the count value of the off-cells in the current highest state is the same as the count value of the off-cells in the initial highest state, or the difference therebetween is less than a reference value, the degradation level may be determined as being low. On the other hand, when the count value of the off-cells in the current highest state is different from the count value of the off-cells in the initial highest state by more than the reference value, the degradation level may be determined as being high.

Similarly to the explanation described above, assuming that a degradation detection signal corresponding to the lowest state is provided to the selected memory cells and the number of on-cells is counted, the control logic 150 may determine the degradation level by comparing the count value of the on-cells in the current lowest state with the count value of the on-cells in the initial lowest state. When the count value of the on-cells in the current lowest state is the same as the count value of the on-cells in the initial lowest state, or the difference therebetween is less than a reference value, the degradation level may be determined as being low. On the other hand, when the count value of the on-cells in the current lowest state is different from the count value of the on-cells in the initial lowest state by more than the reference value, the degradation level may be determined as being high.

In operation S1250, a read parameter may be determined according to the degradation level, and the determined read parameter may be applied to read signal sets. The read parameter may include at least one among at least one number of the read signals, at least one level of the read signals, and at least one reference value defining the error exclusion range in the results of the read operation, which are included in each of the read signal sets. The read signal sets may be provided to the word line of the selected memory cells to execute the read operation.

One of the read signal sets may include at least one read signal. When the read signal set includes a plurality of read signals, the above-described OCVS read operation may be executed, and when the read signal set includes one read signal, a normal read operation may be executed. Accordingly, one page datum may be led by one read signal set. In addition, different page datum configuring one bit page may be led by the read signal sets, and thereby one bit page may be led from the read signals.

The control logic 150 may determine the read parameter by comparing a detected degradation level with a reference degradation level. Normally, variation in distribution of threshold voltages of memory cells may vary according to the program state. For example, the distribution may tend to diffuse relatively rightward in an erase state or a sub-program state, and may tend to be shifted relatively leftward in a main program state. In addition, the variation in distribution of the threshold voltages of the memory cells may be different for word lines. Accordingly, different reference degradation levels may be respectively set in one program state and in another program state among the program states for reading the memory cells. For example, a different reference degradation level may be set in a different program state of the memory cells. In addition, different reference degradation levels may be respectively set in one word line and in another word line among a plurality of word lines connected to the memory cells. For example, a different reference degradation level may be set to memory cells connected to a different word line.

Meanwhile, in the above-described example embodiment of the present inventive concepts, it is described that different reference degradation levels may be respectively set according to the program states of the memory cells to be read and according to the word lines. However, in some example embodiments, the same reference degradation level may be set in the program states of the memory cells to be read, and different levels of degradation detection signals may be respectively provided in one program state and another program state among the program states of the memory cells to be read. In this case, an effect of changing the reference degradation level may be obtained. Similarly, different levels of degradation detection signals may be respectively provided to one word line and another word line among the plurality of word line connected to the memory cells.

The reference degradation level may include a plurality of reference degradation levels. For example, the reference degradation level may include a first reference degradation level and a second reference degradation level. More specifically, the control logic 150 may determine the number of read signals respectively included in the read signal sets by comparing a detected degradation level with the first reference degradation level. For example, when the detected degradation level is lower than the first reference degradation level, the control logic 150 may determine the number of read signals as one. When the number of the read signals of one read signal set is determined as one, the normal read operation may be executed. Meanwhile, when the detected degradation level is lower than the first reference degradation level, at least one level of the read signal may be determined depending on the difference between the detected degradation level and the first reference degradation level.

On the other hand, the control logic 150 may determine the number of read signals as two or more when the detected degradation level is equal to or greater than the first reference degradation level. When the number of the read signals of the read signal set is determined as two or more, the OCVS read operation may be performed. Meanwhile, when the detected degradation level is equal to or greater than the first reference degradation level, the control logic 150 may determine a level of the plurality of the read signals by comparing the detected degradation level with the second reference degradation level higher than first reference degradation level. For example, when the detected degradation level is lower than the second reference degradation level, the control logic 150 may determine the level of the plurality of read signals such that intervals between the plurality of read signals are smaller than a reference interval. In addition, when the detected degradation level is equal to or higher than the second reference degradation level, the control logic 150 may determine the level of the plurality of read signals such that intervals between the plurality of read signals are greater than the reference interval.

The control logic 150 may change a level of a reference value defining the error exclusion range by comparing the detected degradation level with the reference degradation level. For example, the control logic 150 may increase the reference value depending on a difference between the detected degradation level and the reference degradation level. As the memory cells gradually enter the retention state, the degradation level may increase thereby increasing the level of the reference value defining the error exclusion range. For example, the reference value may increase stepwise.

Meanwhile, according to the above-described example embodiment, the read parameter may be determined by comparing the detected degradation level with the reference degradation level. However, in some example embodiments, read parameters corresponding to the degradation levels may be set in the form of a look-up table, and the read parameters included in each of the read signal sets, such as at least one number of the read signals, at least one level of the read signals, and at least one reference value defining the error exclusion range from the results of the read operation, may be determined based on the detected degradation level with reference to the look-up table. Here, the look-up table may include read parameters corresponding to each of different program states of the memory cells. In addition, the look-up table may include read parameters corresponding to each of different word lines.

Figure 13:
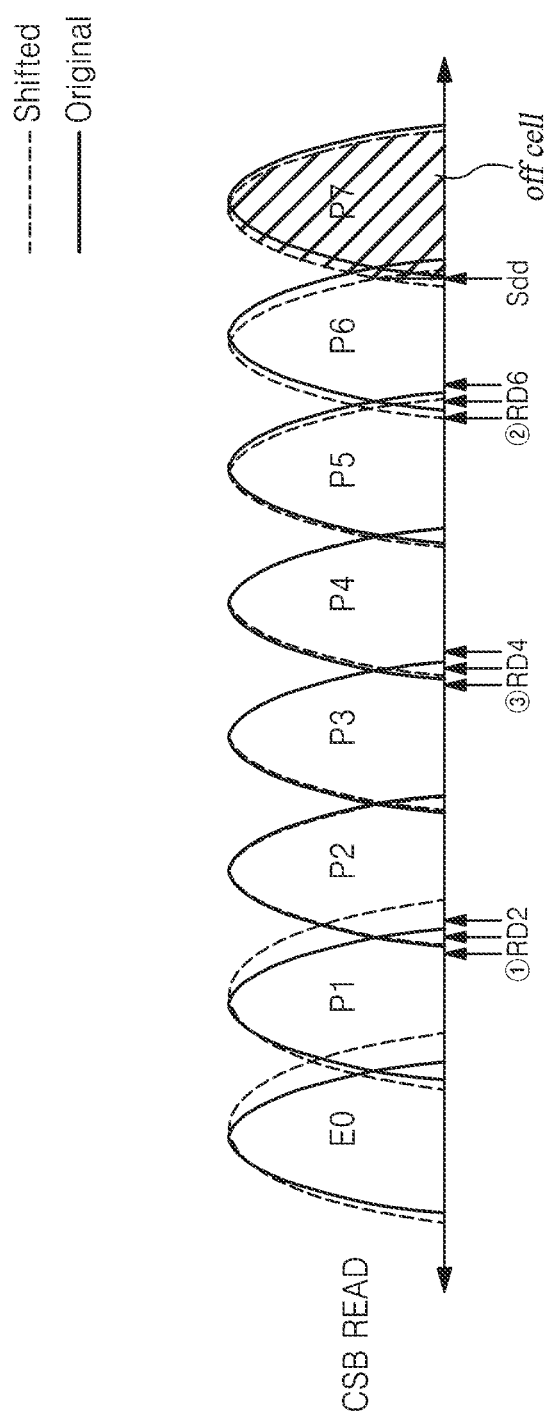
FIG. 13 is a diagram illustrating a method of reading a nonvolatile memory device according to the example embodiment of FIG. 12.

FIG. 13 is a diagram illustrating a method of reading a nonvolatile memory device according to the example embodiment of FIG. 12. In order to describe the example embodiment of the present inventive concepts, a case in which a central significant bit (CSB) page of a triple level cell (TLC) is read will be described as an example.

Before the CSB page is read, a degradation detection signal Sdd may be provided to word lines of selected memory cells. In the example embodiment, the degradation detection signal Sdd may be assumed as having a voltage level corresponding to a threshold voltage disposed between the highest state and a previous state of the highest state, more specifically, between the highest state and a state disposed immediately below the highest state.

The control logic 150 may count the number of off-cells in the highest state when the degradation detection signal Sdd is provided. The control logic 150 may determine a degradation level by comparing a count value of the off-cells in the current highest state with the count value of the off-cells in the initial highest state.

The control logic 150 may determine read parameters applied to a first read signal set RD2, a second read signal set RD6, and a third read signal set RD4 according to the degradation level. In FIG. 13, each of the first read signal set RD2, the second read signal set RD6, and the third read signal set RD4 is illustrated as having a plurality of read signals. However, as described above, the first read signal set RD2, the second read signal set RD6, and the third read signal set RD4 may include at least one read signal. For example, each of the first read signal set RD2, the second read signal set RD6, and the third read signal set RD4 may include one read signal.

Final read data of the CSB page may be output by combining results of read operations based on the first read signal set RD2, the second read signal set RD6, and the third read signal set RD4.

Figure 14:
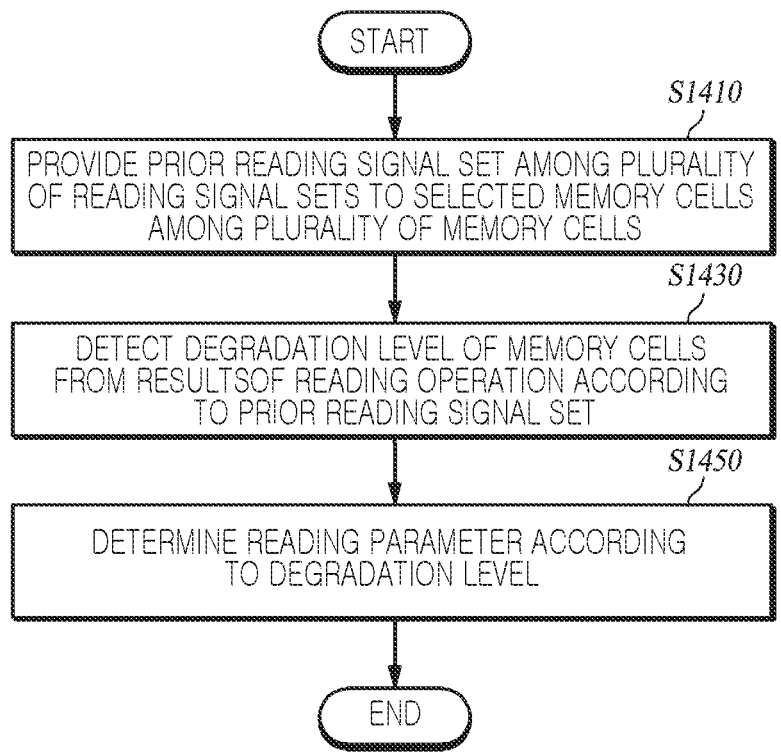
FIG. 14 is a flowchart illustrating a method of compensating for degradation of a nonvolatile memory device according to another example embodiment of the present inventive concepts.

FIG. 14 is a flowchart illustrating a method of compensating for degradation of a nonvolatile memory device according to another example embodiment of the present inventive concepts. Since the example embodiment illustrated in FIG. 14 is similar to that in FIG. 12, duplicated descriptions thereof will be omitted, and differences will be mainly described.

Referring to FIG. 14, in operation S1410, the control logic 150 may provide a prior read signal set among the read signal sets to selected memory cells among a plurality of memory cells. The prior read signal set may include a plurality of read signals. When the prior read signal set is provided, results of the read operation corresponding to prior page datum among page datum configuring one bit page may be latched in a plurality of latch sets. That is, since the prior read signal set is provided, the prior page datum may be read in the OCVS read operation manner. Referring to FIGS. 10A to 10C and FIGS. 11A to 11D, the number of memory cells distributed between the read signals included in the read signal set may be counted from the results of the read operations latched in the plurality of latch sets. In addition, referring to FIGS. 10A to 10C, a difference value between the numbers of the memory cells may be calculated.

In operation S1430, the control logic 150 may detect a degradation level of the selected memory cells based on at least one of the count value and the difference value of the numbers of the memory cells distributed between the read signals when the prior read signal set is provided. For example, the control logic 150 may determine the degradation level by comparing the current count value of the memory cells between the read signals with the initial count value of the memory cells distributed between the read signals. In addition, the control logic 150 may determine the degradation level by comparing the current difference value between the numbers of the memory cells distributed between the read signals with the initial difference value between the numbers of the memory cells disposed between the read signals.

Since the read signals are distributed around a valley to read the page datum, the count values of the numbers of the memory cells distributed between the read signals in the initial state and the difference value therebetween may be set at a low level. However, as the memory cells gradually enter the retention state, the distribution of the threshold voltages may be shifted to the right in the case of an erase state or a sub-program state, and shifted to the left in the case of a main program state. Accordingly, the count values of the numbers of the memory cells distributed between the read signals and the difference value therebetween may be changed to a high level.

Accordingly, the control logic 150 may determine that the degradation level is low when the count values of the numbers of the memory cells distributed between the read signals and the difference value are the same as those in the initial state or the difference is less than reference value.

In addition, the control logic 150 may determine that the degradation level is high when the count values of the numbers of the memory cells distributed between the read signals and the difference value are the same as those in the initial state or the difference is equal to or greater than the reference value.

In operation S1450, the read parameters may be determined according to the degradation level, and the determined read parameters may be applied to a subsequent read signal sets. The subsequent read signal sets may be provided to the word line of the selected memory cells to perform the subsequent read operation. Different page datum configuring one bit page may be read from the subsequent read signal sets, and each of the subsequent read signal sets may include at least one read signal.

Figure 15:
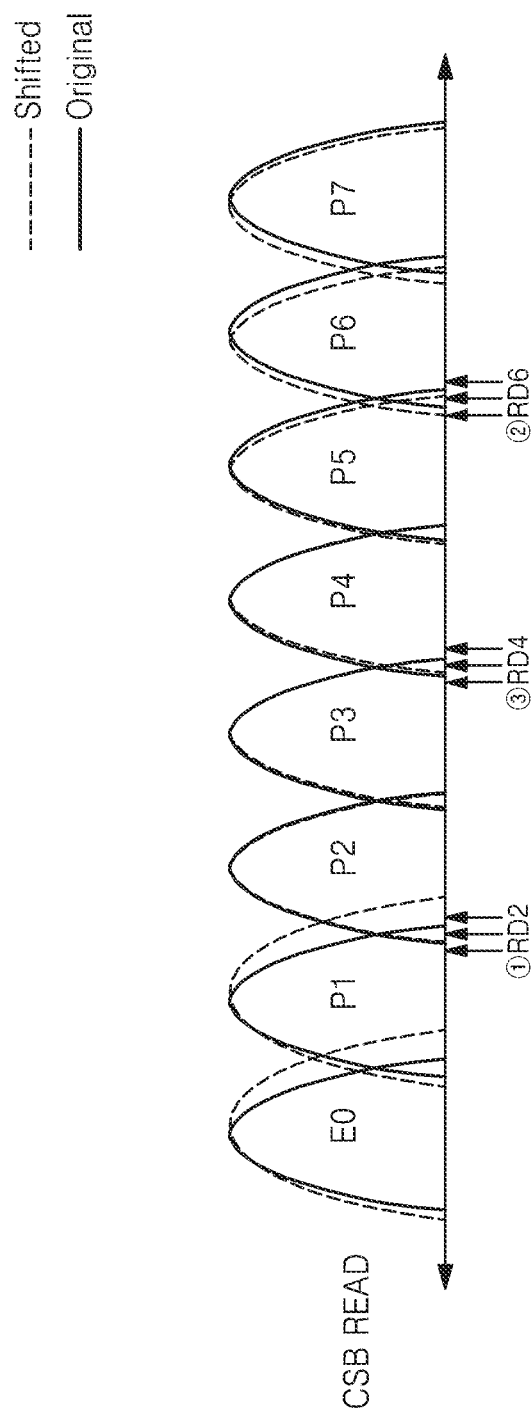
FIG. 15 is a diagram illustrating a method of reading a nonvolatile memory device according to the example embodiment of FIG. 14.

FIG. 15 is a diagram illustrating a method of reading a nonvolatile memory device according to the example embodiment of FIG. 14. In order to describe the example embodiment of the present inventive concepts, a case in which a central significant bit (CSB) page of a triple level cell (TLC) is read will be described.

Referring to FIG. 15, the control logic 150 may provide a prior read signal set among read signal sets to selected memory cells among a plurality of memory cells. In the example embodiment, it is assumed that a first read signal set RD2 including a plurality of read voltages is a prior read signal set and a second read signal set RD6 including at least one read voltage and a third read signal set RD4 including at least one read voltage are subsequent read signal sets. In FIG. 15, each of the second read signal set RD6 and third read signal set RD4 may include a plurality of read signals. However, as described above, the second read signal set RD6 and the third read signal set RD4 may include at least one read signal. For example, each of the first read signal set RD2, the second read signal set RD6, and the third read signal set RD4 may include one read signal. Meanwhile, in the above-described example embodiment, although the first read signal set RD2 is defined as the prior read signal set, and the second read signal set RD6 and the third read signal set RD4 are defined as the subsequent read signal sets, one of the second read signal set RD6 and the third read signal set RD4 may be defined as the prior read signal set, and the other read signal sets may be defined as the subsequent read signal. That is, the prior/subsequent read signal sets may vary according to example embodiments of the present inventive concepts.

When the first read signal set RD2 including a plurality of read voltages is provided, results of read operations for distinguishing program states P1 and P2 among page datum configuring the CSB page may be latched in a plurality of latch sets. From the results of read operations, the number of memory cells disposed between the plurality of read voltages of the first read signal set RD2 may be counted and a difference value between the numbers of the memory cells may be calculated.

The control logic 150 may determine a degradation level by comparing a current count value of the memory cells disposed between the plurality of read voltages of the first read signal set RD2 with an initial count value of the memory cells disposed between the plurality of read voltages of the first read signal set RD2. In addition, the control logic 150 may determine the degradation level by comparing the current difference value between the numbers of the memory cells disposed between the plurality of read voltages of the first read signal set RD2 with the initial difference value between the numbers of the memory cells disposed between the plurality of read voltages of the first read signal set RD2.

The control logic 150 may determine read parameters applied to the second read signal set RD6 and the third read signal set RD4 corresponding to the subsequent read signal sets, according to the degradation level. By combining the results of the read operations according to the first read signal set RD2, the second read signal set RD6, and the third read signal set RD4, final read data of the CSB page may be output.

Meanwhile, in the above-described explanation, the read parameters applied to the second read signal set and the third read signal set may be determined according to the degradation level of the memory cells detected according to the first read signal set corresponding to the prior read signal set. However, in some example embodiments, the read parameters applied to the second read signal set may be determined based on the degradation level of the memory cells detected according to the first read signal set, and the read parameters applied to the third read signal set may be determined based on the degradation level of the memory cells detected according to the second read signal set.

In addition, in some example embodiments, the read parameters applied to the first read signal set corresponding to the prior read signal set may be determined based on the degradation level detected according to the above-described degradation detection signal. That is, the read parameter determined based on the degradation detection signal may be applied to the operation of the first read signal set, the read parameter determined based on the first read signal set may be applied to the operation of the second read signal set, and the read parameter determined based on the second read signal set may be applied to the operation of the third read signal set.

As described above, the read parameters may be determined by comparing the detected degradation level with the reference degradation level, or the read parameters corresponding to the degradation level may be provided in the form of a look-up table and determined based on the detected degradation level with reference to the look-up table.

Meanwhile, a reference value, defining an error exclusion range, among the read parameters according to the example embodiment of the present inventive concepts may be determined according to a count value calculated by grouping the page buffers PB1 to PBn of one page buffer into a plurality of count sections and sequentially counting the plurality of count sections.

Hereinafter, a method of determining a reference value according to an example embodiment of the present inventive concepts will be described in detail with reference to FIG. 16.

Figure 16:
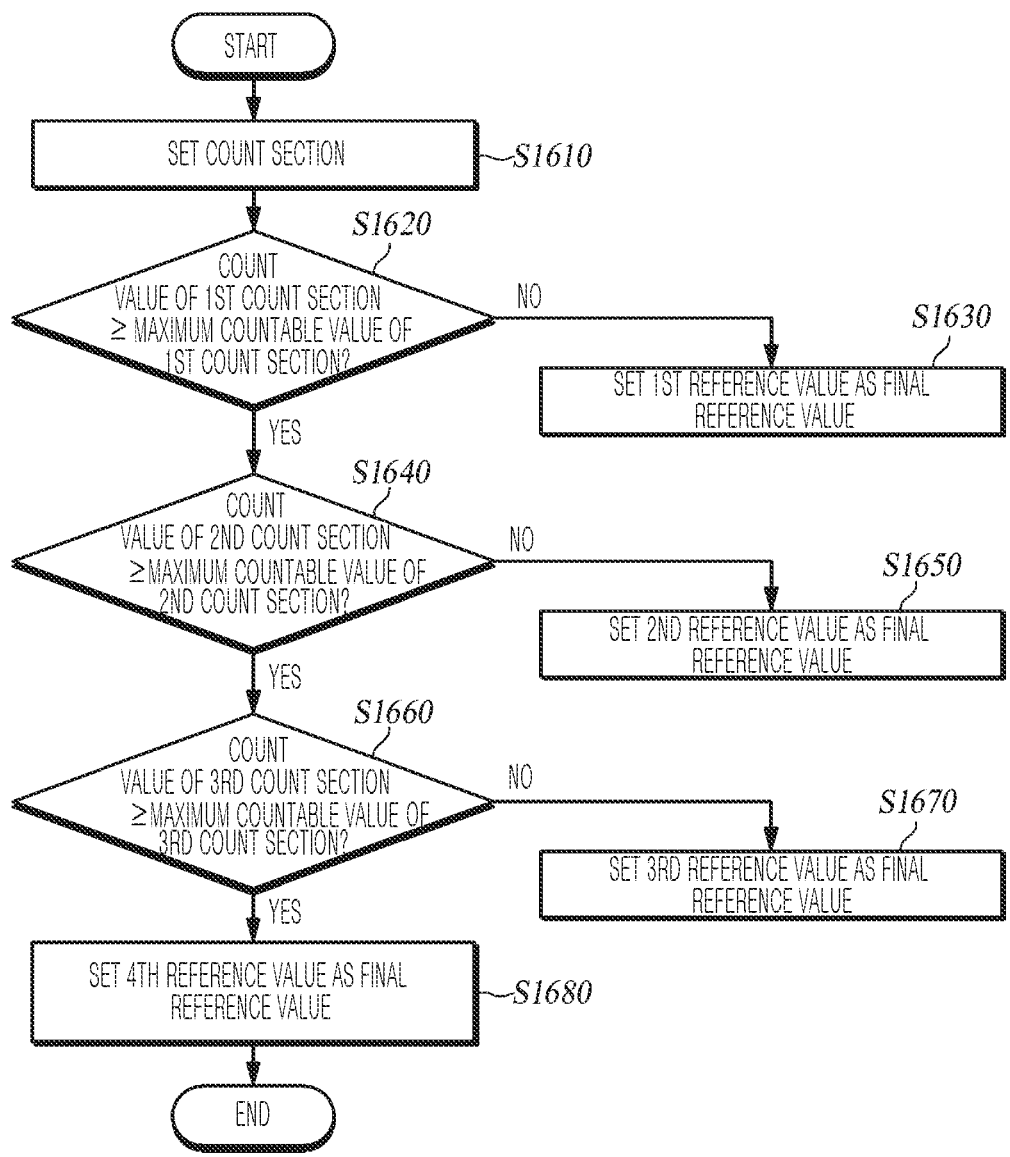
FIG. 16 is a flowchart provided to describe a method of determining a reference value according to an example embodiment of the present inventive concepts.

FIG. 16 is a flowchart provided to describe a method of determining a reference value according to an example embodiment of the present inventive concepts.

Referring to FIG. 16, in operation S1610, the control logic 150 may group the page buffers PB1 to PBn of one page buffer to set a plurality of count sections. At least one of the page buffers PB1 to PBn may be included in each of the plurality of count sections. For example, the page buffers PB1 to PBn may be grouped into the same number to set a plurality (N: a natural number of 2 or more) of count sections. The following description will be given on the assumption that the number (N: a natural number of 2 or more) of the count sections is three for ease of explanation.

In operation S1620, the control logic 150 may compare a count value of a first count section with a maximum countable value of the first count section. Here, the maximum countable value of the first count section may correspond to a maximum value of a first reference bit allocated in the first count section. More specifically, a counter connected to at least one page buffer of the first count section may count memory cells in the first reference bit. For example, the first reference bit may correspond to 8 bits.

In operation S1630, when the count value of the first count section is less than the maximum countable value of the first count section, the control logic 150 may determine a final reference value as a first reference value corresponding to the first count section or the first reference bit. In this case, since data are uniformly distributed in the page buffers PB1 to PBn of one page buffer, the count value of the entire count sections may be calculated by multiplying the count value of the first count section by N/(N−2). On the other hand, the count value of the entire count sections may be calculated by adding count values of the first count section, the second count section, and the third count section.

In operation S1640, when the count value of the first count section is equal to or greater than the maximum countable value of the first count section, the control logic 150 may compare the count value of the second count section with a maximum countable value of the second count section. Here, the maximum countable value of the second count section may correspond to a maximum value of a second reference bit allocated in the second count section. More specifically, a counter connected to at least one page buffer of the second count section may count memory cells in the second reference bit. For example, the second reference bit may correspond to twice the first reference bit, and the second reference bit may correspond to 16 bits.

In operation S1650, when the count value of the second count section is less than the maximum countable value of the second count section, the control logic 150 may determine the final reference value as a second reference value corresponding to the second count section or the second reference bit. For example, the second reference value may correspond to twice the first reference value. In this case, since data are uniformly distributed in the page buffers PB1 to PBn of one page buffer, the count value of the entire count sections may be calculated by multiplying the count value of the second count section by N/(N−2). On the other hand, the count value of the entire count sections may be calculated by adding the count values of the first count section, the second count section, and the third count section.

In operation S1660, when the count value of the second count section is equal to or greater than the maximum countable value of the second count section, the control logic 150 may compare the count value of the third count section with a maximum countable value of the third count section. Here, the maximum countable value of the third count section may correspond to a maximum value of a third reference bit allocated in the third count section. More specifically, a counter connected to at least one page buffer of the third count section may count memory cells in the third reference bit. For example, the third reference bit may correspond to twice the second reference bit, and the third reference bit may correspond to 32 bits.

In operation S1670, when the count value of the third count section is less than the maximum countable value of the third count section, the control logic 150 may determine the final reference value as a third reference value corresponding to the third count section or the third reference bit. For example, the third reference value may correspond to twice the second reference value. In this case, since data are uniformly distributed in the page buffers PB1 to PBn of one page buffer, the count value of the entire count sections may be calculated by multiplying the count value of the third count section by N/(N−2). On the other hand, the count value of the entire count sections may be calculated by adding the count values of the first count section, the second count section, and the third count section.

In operation S1680, when the count value of the third count section is equal to or greater than the maximum countable value of the third count section, the control logic 150 may determine the final reference value as a fourth reference value. For example, the fourth reference value may correspond to twice the third reference value.

In the above-described example embodiment, the first count section, the second count section, and the third count section are described as being sequentially counted, based on the previous count result. However, since data are uniformly distributed in the page buffers PB1 to PBn of one page buffer, the reference value may be determined in the above-described manner by selecting one of the first count section to the third count section and comparing the count value of the selected count section with the maximum value of the first reference bit, the maximum value of the second reference bit, and the maximum value of the third reference bit.

Figure 17:
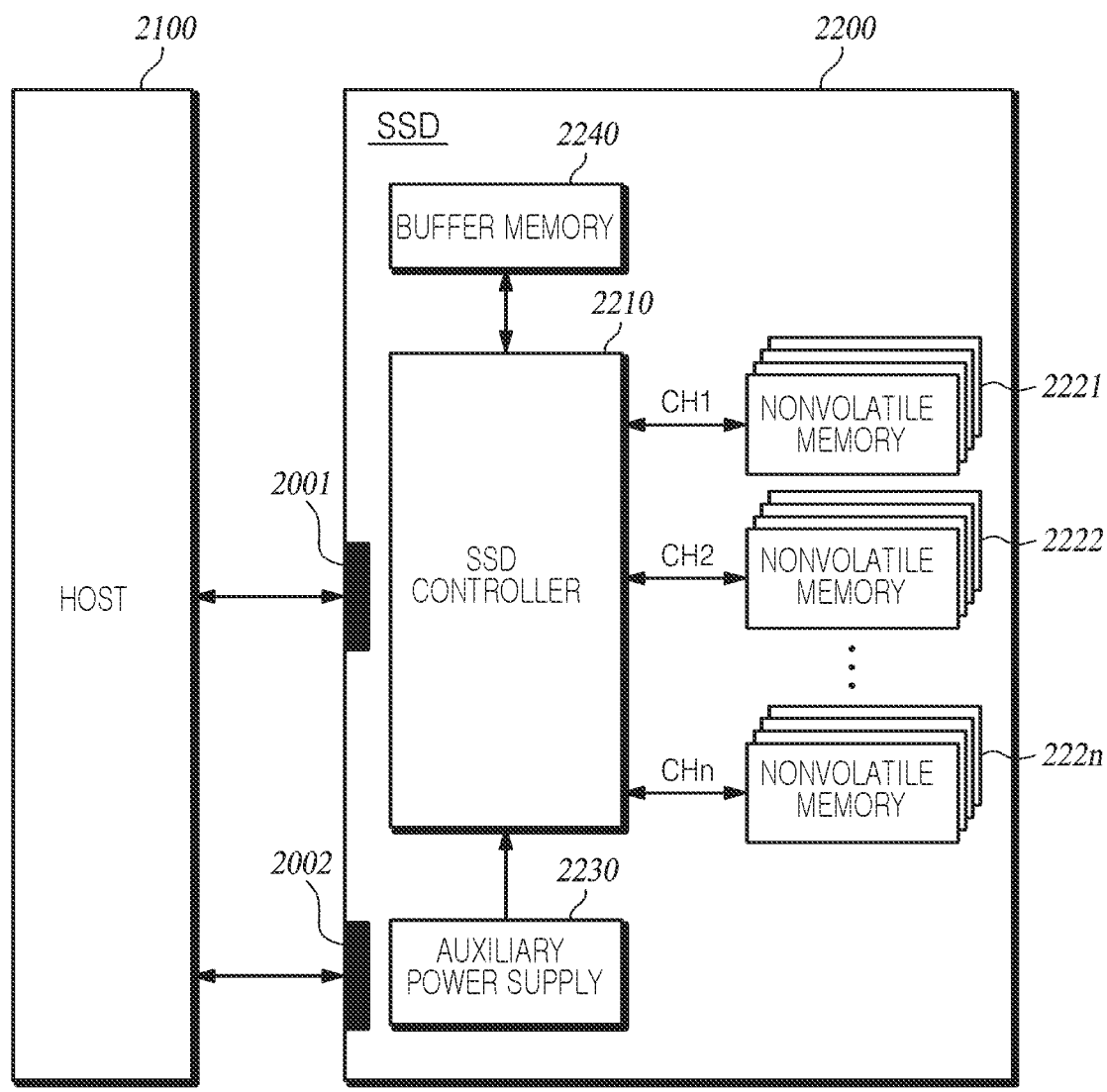
FIG. 17 is a block diagram illustrating a solid state drive (SSD) system including a nonvolatile memory system according to an example embodiment of the present inventive concepts.

FIG. 17 is a block diagram illustrating a solid state drive (SSD) system including a nonvolatile memory system according to an example embodiment of the present inventive concepts.

Referring to FIG. 17, an SSD system 2000 may include a host 2100 and an SSD 2200. The SSD 2200 may exchange signals SIG with the host 2100 through a signal connector 2001 and may receive power PWR through a power connector 2002.

The SSD 2200 may include an SSD controller 2210, a plurality of flash memories 2221 to 222n, an auxiliary power supply 2230, and a buffer memory 2240.

The SSD controller 2210 may control the plurality of flash memories $222_1$ to $222_n$ in response to the signal SIG received from the host 2100.

The auxiliary power supply 2230 may be connected to the host 2100 through the power connector 2002. The auxiliary power supply 2230 may receive the power PWR from the host 2100, to be charged by the power PWR. The auxiliary power supply 2230 may supply power of the SSD system 2000 when power from the host 2100 is not smoothly supplied. For example, the auxiliary power supply 2230 may be disposed inside or outside the SSD 2200. For example, the auxiliary power supply 2230 may be disposed in a main board to supply auxiliary power to the SSD 2200.

The buffer memory 2240 may be operated as a buffer memory of the SSD 2200. For example, the buffer memory 2240 may temporarily store data received from the host 2100 or data received from the plurality of flash memories 2221 to 222n, or temporarily store metadata (e.g. mapping tables) of the plurality of flash memories 2221 to 222n. The buffer memory 2240 may include volatile memories such as a DRAM, an SDRAM, a DDR SDRAM, an LPDDR SDRAM, or an SRAM, or nonvolatile memories such as an FRAM, a ReRAM, an STT-MRAM, or a PRAM.

As set forth above, according to example embodiments of the present inventive concepts, in order to identify a specific data state in a nonvolatile memory device, a plurality of sensing processes may be executed and data having a minimum number of error bits among data respectively latched in the sensing processes may be output. In addition, according to the example embodiments of the present inventive concepts, a reference value defining an error exclusion range may be compensated according to the degradation in threshold voltage distribution, thereby ensuring reliable operations of the nonvolatile memory device.

According to one or more example embodiments, the units and/or devices described above, such as the components of the non-volatile memory including the control logic 150 and the sub-components thereof including the OCVS circuit 155, the page buffer 130 and cell counter 170, may be implemented using hardware, a combination of hardware and software, or a non-transitory storage medium storing software that is executable to perform the functions of the same.

Hardware may be implemented using processing circuitry such as, but not limited to, one or more processors, one or more Central Processing Units (CPUs), one or more controllers, one or more arithmetic logic units (ALUs), one or more digital signal processors (DSPs), one or more microcomputers, one or more field programmable gate arrays (FPGAs), one or more System-on-Chips (SoCs), one or more programmable logic units (PLUs), one or more microprocessors, one or more Application Specific Integrated Circuits (ASICs), or any other device or devices capable of responding to and executing instructions in a defined manner.

Software may include a computer program, program code, instructions, or some combination thereof, for independently or collectively instructing or configuring a hardware device to operate as desired. The computer program and/or program code may include program or computer-readable instructions, software components, software modules, data files, data structures, etc., capable of being implemented by one or more hardware devices, such as one or more of the hardware devices mentioned above. Examples of program code include both machine code produced by a compiler and higher level program code that is executed using an interpreter.

For example, when a hardware device is a computer processing device (e.g., one or more processors, CPUs, controllers, ALUs, DSPs, microcomputers, microprocessors, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor. In another example, the hardware device may be an integrated circuit customized into special purpose processing circuitry (e.g., an ASIC).

A hardware device, such as a computer processing device, may run an operating system (OS) and one or more software applications that run on the OS. The computer processing device also may access, store, manipulate, process, and create data in response to execution of the software. For simplicity, one or more example embodiments may be exemplified as one computer processing device; however, one skilled in the art will appreciate that a hardware device may include multiple processing elements and multiple types of processing elements. For example, a hardware device may include multiple processors or a processor and a controller. In addition, other processing configurations are possible, such as parallel processors.

Software and/or data may be embodied permanently or temporarily in any type of storage media including, but not limited to, any machine, component, physical or virtual equipment, or computer storage medium or device, capable of providing instructions or data to, or being interpreted by, a hardware device. The software also may be distributed over network coupled computer systems so that the software is stored and executed in a distributed fashion. In particular, for example, software and data may be stored by one or more computer readable recording mediums, including tangible or non-transitory computer-readable storage media as discussed herein.

Storage media may also include one or more storage devices at units and/or devices according to one or more example embodiments. The one or more storage devices may be tangible or non-transitory computer-readable storage media, such as random access memory (RAM), read only memory (ROM), a permanent mass storage device (such as a disk drive), and/or any other like data storage mechanism capable of storing and recording data. The one or more storage devices may be configured to store computer programs, program code, instructions, or some combination thereof, for one or more operating systems and/or for implementing the example embodiments described herein. The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

The one or more hardware devices, the storage media, the computer programs, program code, instructions, or some combination thereof, may be specially designed and constructed for the purposes of the example embodiments, or they may be known devices that are altered and/or modified for the purposes of example embodiments.

While example embodiments have been shown and described above, it will be apparent to those skilled in the art that modifications and variations could be made without departing from the scope of the present inventive concepts as defined by the appended claims.

What is claimed is:

1. A nonvolatile memory device, comprising:
    a page buffer including a plurality of latch sets that latch respective page data of memory cells according to respective read signal sets, the read signal sets including a prior read signal set and subsequent read signal sets; and
    control logic configured to,
        detect a degradation level of the memory cells by one or more of (i) comparing a current count value of the memory cells between a plurality of read signals included in the prior read signal set with an initial count value of the memory cells distributed between the plurality of read signals, and (ii) comparing a current difference value of the memory cells between the plurality of read signals included in the prior read signal set with an initial difference value of the memory cells distributed between the plurality of read signals, and
        determine a read parameter applied to the subsequent read signal sets based on the degradation level of the memory cells detected based on a result of the comparing using the prior read signal set.

2. The nonvolatile memory device of claim 1, wherein a reference degradation level includes a first reference degradation level and a second reference degradation level higher than the first reference degradation level, and
    the control logic is configured to compare the degradation level with the first reference degradation level to determine a number of read signals in each of the read signal sets, the read signal sets each including at least one read signal.

3. The nonvolatile memory device of claim 1, wherein a reference degradation level includes a first reference degradation level and a second reference degradation level higher than the first reference degradation level, and
    the control logic is configured to compare the degradation level with the second reference degradation level to determine levels of read signals in each of the read signal sets.

4. The nonvolatile memory device of claim 1, wherein the read parameter includes a reference value defining an error exclusion range of a result of at least one read operation such that a level of the reference value increases as the degradation level of the memory cells increases.

5. The nonvolatile memory device of claim 4, wherein the level of the reference value increases stepwise.

6. The nonvolatile memory device of claim 1, wherein the subsequent read signal sets includes a first subsequent read signal set and a second subsequent read signal set, and
    the control logic is configured to detect the degradation level of the memory cells based on the first subsequent read signal set, and to determine a read parameter applied to the second subsequent read signal set based on the degradation level detected based on the first subsequent read signal set.

7. The nonvolatile memory device of claim 1, wherein the control logic is configured to,
    detect the degradation level of the memory cells by providing a degradation detection signal preceding the prior read signal set to a word line of the memory cells, and
    determine the read parameter applied to the prior read signal set based on the degradation level.

8. The nonvolatile memory device of claim 7, wherein the control logic is configured to,
    set one reference degradation level applied equally to the memory cells,
    obtain the degradation level of the memory cells by inputting the degradation detection signal to the memory cells, and
    determine a read parameter for the memory cells by comparing the degradation level of the memory cells with the one reference degradation level.

9. A nonvolatile memory device, comprising:
    a page buffer including a plurality of latch sets that latch respective page data of memory cells according to respective read signal sets, the read signal sets including a prior read signal set and subsequent read signal sets; and
    control logic configured to, for each read operation of memory cells connected to different word lines among word lines connected to the memory cells,
        detect a degradation level of the memory cells by one or more of (i) comparing a current count value of the memory cells between a plurality of read signals included in the prior read signal set with an initial count value of the memory cells distributed between the plurality of read signals, and (ii) comparing a current difference value of the memory cells between the plurality of read signals included in the prior read signal set with an initial difference value of the memory cells distributed between the plurality of read signals, and
        determine a read parameter applied to the subsequent read signal sets based on the degradation level detected based on a result of the comparing using the prior read signal set.

10. The nonvolatile memory device of claim 9, wherein read parameters corresponding to degradation levels are set to a Look-up Table, and the control logic is configured to determine the read parameters included in each of the read signal sets by referring to the Look-up Table according to the degradation level.

11. A nonvolatile memory device, comprising:
    a page buffer unit connected to a memory cell array including a plurality of memory cells, the page buffer unit including a plurality of page buffers configured to store page data of the memory cells; and
    control logic configured to group the page buffers into a plurality of count sections, and to define an error exclusion range of a read operation of the memory cells based on a count value of at least one of the plurality of count sections.

12. The nonvolatile memory device of claim 11, wherein the control logic is configured to compare a count value of the at least one of the plurality of count sections with a maximum countable value of the at least one of the plurality of count sections.

13. The nonvolatile memory device of claim 12, wherein the control logic is configured to determine a reference value corresponding to the maximum countable value as a final reference value in response to the count value of the at least one of the plurality of count sections being smaller than the maximum countable value.

14. The nonvolatile memory device of claim 12, wherein the control logic is configured to compare a count value of a next count section of the plurality of count sections with a maximum countable value of the next count section, in response to the at least one of the plurality of count values being greater than or equal to the maximum countable value.

15. The nonvolatile memory device of claim 14, wherein the maximum countable value and a reference value corresponding to the maximum countable value of the next count section are greater than the maximum countable value and a reference value corresponding to the maximum countable value of a previous count section of the plurality of count sections, respectively.

16. The nonvolatile memory device of claim 11, wherein the control logic is configured to compare a count value of one count section of the plurality of count sections with a first maximum countable value.

17. The nonvolatile memory device of claim 16, wherein the control logic is configured to determine a reference value corresponding to the first maximum countable value as a final reference value, in response to the count value of the one count section being smaller than the first maximum countable value.

18. The nonvolatile memory device of claim 16, wherein the control logic is configured to compare the count value with a second maximum countable value, in response to the count value of the one count section being greater than or equal to the first maximum countable value, the second maximum countable value being greater than the first maximum countable value.

* * * * *